US012119380B2

(12) United States Patent
Weeks et al.

(10) Patent No.: US 12,119,380 B2
(45) Date of Patent: Oct. 15, 2024

(54) METHOD FOR MAKING SEMICONDUCTOR DEVICE INCLUDING SUPERLATTICE WITH OXYGEN AND CARBON MONOLAYERS

(71) Applicant: ATOMERA INCORPORATED, Los Gatos, CA (US)

(72) Inventors: Keith Doran Weeks, Chandler, AZ (US); Nyles Wynn Cody, Tempe, AZ (US); Marek Hytha, Brookline, MA (US); Robert J. Mears, Wellesley, MA (US); Robert John Stephenson, Duxford (GB); Hideki Takeuchi, San Jose, CA (US)

(73) Assignee: ATOMERA INCORPORATED, Los Gatos, CA (US)

( * ) Notice: Subject to any disclaimer, the term of this patent is extended or adjusted under 35 U.S.C. 154(b) by 0 days.

(21) Appl. No.: 18/386,735

(22) Filed: Nov. 3, 2023

(65) Prior Publication Data
US 2024/0063268 A1 Feb. 22, 2024

Related U.S. Application Data

(63) Continuation of application No. 17/305,101, filed on Jun. 30, 2021, now Pat. No. 11,848,356.
(Continued)

(51) Int. Cl.
*H01L 29/15* (2006.01)
*H01L 29/66* (2006.01)
*H01L 29/78* (2006.01)

(52) U.S. Cl.
CPC ...... *H01L 29/152* (2013.01); *H01L 29/66477* (2013.01); *H01L 29/7849* (2013.01)

(58) Field of Classification Search
CPC ............ H01L 29/152; H01L 29/66477; H01L 29/7849; H01L 29/0847; H01L 29/1054;
(Continued)

(56) References Cited

U.S. PATENT DOCUMENTS

| 4,937,204 A | 6/1990 | Ishibashi et al. |
| 5,216,262 A | 6/1993 | Tsu |

(Continued)

FOREIGN PATENT DOCUMENTS

| EP | 3648172 | 5/2020 |
| GB | 2347520 | 6/2000 |
| TW | 200845388 | 11/2008 |

OTHER PUBLICATIONS

U.S. Appl. No. 16/513,825, filed 17/17/2019; Burton et al. See Priority U.S. Appl. No. 17/305,161, filed Jun. 20, 2021.
(Continued)

*Primary Examiner* — Calvin Y Choi
(74) *Attorney, Agent, or Firm* — ALLEN, DYER, DOPPELT, GILCHRIST, P.A.

(57) ABSTRACT

A method for making a semiconductor device may include forming a superlattice adjacent a semiconductor layer. The superlattice may include a plurality of stacked groups of layers, with each group of layers including a plurality of stacked base semiconductor monolayers defining a base semiconductor portion, and at least one non-semiconductor monolayer constrained within a crystal lattice of adjacent base semiconductor portions. The at least one non-semiconductor monolayer in a first group of layers of the superlattice may comprise oxygen and be devoid of carbon, and the at least one non-semiconductor monolayer in a second group of layers of the superlattice may comprise carbon.

15 Claims, 19 Drawing Sheets

Related U.S. Application Data

(60) Provisional application No. 63/047,356, filed on Jul. 2, 2020.

(58) Field of Classification Search
CPC ... H01L 29/165; H01L 29/665; H01L 29/775; H01L 29/7833; H01L 21/02381; H01L 21/0245; H01L 21/02488; H01L 21/02507; H01L 21/02532; H01L 21/0262
See application file for complete search history.

(56) References Cited

U.S. PATENT DOCUMENTS

| | | |
|---|---|---|
| 5,357,119 A | 10/1994 | Wang et al. |
| 5,683,934 A | 11/1997 | Candelaria |
| 5,796,119 A | 8/1998 | Seabaugh |
| 6,141,361 A | 10/2000 | Mears et al. |
| 6,376,337 B1 | 4/2002 | Wang et al. |
| 6,472,685 B2 | 10/2002 | Takagi |
| 6,741,624 B2 | 5/2004 | Mears et al. |
| 6,830,964 B1 | 12/2004 | Mears et al. |
| 6,833,294 B1 | 12/2004 | Mears et al. |
| 6,878,576 B1 | 4/2005 | Mears et al. |
| 6,891,188 B2 | 5/2005 | Mears et al. |
| 6,897,472 B2 | 5/2005 | Mears et al. |
| 6,927,413 B2 | 8/2005 | Mears et al. |
| 6,952,018 B2 | 10/2005 | Mears et al. |
| 6,958,486 B2 | 10/2005 | Mears et al. |
| 6,993,222 B2 | 1/2006 | Mears et al. |
| 7,018,900 B2 | 3/2006 | Kreps |
| 7,033,437 B2 | 4/2006 | Mears et al. |
| 7,034,329 B2 | 4/2006 | Mears et al. |
| 7,045,377 B2 | 5/2006 | Mears et al. |
| 7,045,813 B2 | 5/2006 | Mears et al. |
| 7,071,119 B2 | 7/2006 | Mears et al. |
| 7,105,895 B2 | 9/2006 | Wang et al. |
| 7,109,052 B2 | 9/2006 | Mears et al. |
| 7,123,792 B1 | 10/2006 | Mears et al. |
| 7,148,712 B1 | 12/2006 | Prey, Jr. et al. |
| 7,153,763 B2 | 12/2006 | Hytha et al. |
| 7,202,494 B2 | 4/2007 | Blanchard et al. |
| 7,227,174 B2 | 6/2007 | Mears et al. |
| 7,229,902 B2 | 6/2007 | Mears et al. |
| 7,265,002 B2 | 9/2007 | Mears et al. |
| 7,279,699 B2 | 10/2007 | Mears et al. |
| 7,279,701 B2 | 10/2007 | Kreps |
| 7,288,457 B2 | 10/2007 | Kreps |
| 7,303,948 B2 | 12/2007 | Mears et al. |
| 7,432,524 B2 | 10/2008 | Mears et al. |
| 7,435,988 B2 | 10/2008 | Mears et al. |
| 7,436,026 B2 | 10/2008 | Kreps |
| 7,446,002 B2 | 11/2008 | Mears et al. |
| 7,446,334 B2 | 11/2008 | Mears et al. |
| 7,491,587 B2 | 2/2009 | Rao |
| 7,514,328 B2 | 4/2009 | Rao |
| 7,517,702 B2 | 4/2009 | Halilov et al. |
| 7,531,828 B2 | 5/2009 | Mears et al. |
| 7,531,829 B2 | 5/2009 | Blanchard |
| 7,531,850 B2 | 5/2009 | Blanchard |
| 7,586,116 B2 | 9/2009 | Kreps et al. |
| 7,586,165 B2 | 9/2009 | Blanchard |
| 7,598,515 B2 | 10/2009 | Mears et al. |
| 7,612,366 B2 | 11/2009 | Mears et al. |
| 7,625,767 B2 | 12/2009 | Huang et al. |
| 7,659,539 B2 | 2/2010 | Kreps et al. |
| 7,700,447 B2 | 4/2010 | Dukovski et al. |
| 7,718,996 B2 | 5/2010 | Dukovski et al. |
| 7,781,827 B2 | 8/2010 | Rao |
| 7,812,339 B2 | 10/2010 | Mears et al. |
| 7,863,066 B2 | 1/2011 | Mears et al. |
| 7,880,161 B2 | 2/2011 | Mears et al. |
| 7,928,425 B2 | 4/2011 | Rao |
| 8,389,974 B2 | 3/2013 | Mears et al. |
| 9,275,996 B2 | 3/2016 | Mears et al. |
| 9,406,753 B2 | 8/2016 | Mears et al. |
| 9,558,939 B1 | 1/2017 | Stephenson et al. |
| 9,899,479 B2 | 2/2018 | Mears et al. |
| 9,941,359 B2 | 4/2018 | Mears et al. |
| 9,972,685 B2 | 5/2018 | Mears et al. |
| 10,084,045 B2 | 9/2018 | Mears et al. |
| 10,107,854 B2 | 10/2018 | Roy |
| 10,109,342 B2 | 10/2018 | Roy |
| 10,109,479 B1* | 10/2018 | Mears ............... H01L 21/02164 |
| 10,170,560 B2 | 1/2019 | Mears |
| 10,170,603 B2 | 1/2019 | Mears et al. |
| 10,170,604 B2 | 1/2019 | Mears et al. |
| 10,191,105 B2 | 1/2019 | Roy |
| 10,249,745 B2 | 4/2019 | Mears et al. |
| 10,276,625 B1 | 4/2019 | Mears et al. |
| 10,304,881 B1 | 5/2019 | Chen et al. |
| 10,355,151 B2 | 7/2019 | Chen et al. |
| 10,361,243 B2 | 7/2019 | Mears et al. |
| 10,367,028 B2 | 7/2019 | Chen et al. |
| 10,367,064 B2 | 7/2019 | Rao |
| 10,381,242 B2 | 8/2019 | Takeuchi |
| 10,396,223 B2 | 8/2019 | Chen et al. |
| 10,410,880 B2 | 9/2019 | Takeuchi |
| 10,453,945 B2 | 10/2019 | Mears et al. |
| 10,461,118 B2 | 10/2019 | Chen et al. |
| 10,468,245 B2 | 11/2019 | Weeks et al. |
| 10,529,757 B2 | 1/2020 | Chen et al. |
| 10,529,768 B2 | 1/2020 | Chen et al. |
| 10,566,191 B1 | 2/2020 | Weeks et al. |
| 10,580,866 B1 | 3/2020 | Takeuchi et al. |
| 10,580,867 B1 | 3/2020 | Takeuchi et al. |
| 10,593,761 B1 | 3/2020 | Taekuchi et al. |
| 10,608,027 B2 | 3/2020 | Chen et al. |
| 10,608,043 B2 | 3/2020 | Chen et al. |
| 10,615,209 B2 | 4/2020 | Chen et al. |
| 10,636,879 B2 | 4/2020 | Rao |
| 10,727,049 B2 | 7/2020 | Weeks et al. |
| 10,741,436 B2 | 8/2020 | Stephenson et al. |
| 10,763,370 B2 | 9/2020 | Stephenson |
| 10,777,451 B2 | 9/2020 | Stephenson et al. |
| 10,811,498 B2 | 10/2020 | Weeks et al. |
| 10,818,755 B2 | 10/2020 | Takeuchi et al. |
| 10,825,901 B1 | 11/2020 | Burton et al. |
| 10,825,902 B1 | 11/2020 | Burton et al. |
| 10,840,335 B2 | 11/2020 | Takeuchi et al. |
| 10,840,336 B2 | 11/2020 | Connelly et al. |
| 10,840,337 B2 | 11/2020 | Takeuchi et al. |
| 10,840,388 B1 | 11/2020 | Burton et al. |
| 10,847,618 B2 | 11/2020 | Takeuchi et al. |
| 10,854,717 B2 | 12/2020 | Takeuchi et al. |
| 10,868,120 B1 | 12/2020 | Burton et al. |
| 2002/0011628 A1 | 1/2002 | Takagi |
| 2003/0034529 A1 | 2/2003 | Fitzgerald et al. |
| 2003/0057416 A1 | 3/2003 | Currie et al. |
| 2005/0282330 A1 | 12/2005 | Mears et al. |
| 2006/0220118 A1 | 10/2006 | Stephenson et al. |
| 2006/0267130 A1 | 11/2006 | Rao |
| 2006/0273299 A1 | 12/2006 | Stephenson et al. |
| 2006/0292765 A1 | 12/2006 | Blanchard et al. |
| 2007/0007508 A1 | 1/2007 | Mears et al. |
| 2007/0010040 A1 | 1/2007 | Mears et al. |
| 2007/0012910 A1 | 1/2007 | Mears et al. |
| 2007/0015344 A1 | 1/2007 | Mears et al. |
| 2007/0020833 A1 | 1/2007 | Mears et al. |
| 2007/0020860 A1 | 1/2007 | Mears et al. |
| 2008/0012004 A1 | 1/2008 | Huang et al. |
| 2008/0128806 A1 | 6/2008 | Liu et al. |
| 2008/0258134 A1 | 10/2008 | Mears et al. |
| 2009/0068824 A1 | 3/2009 | Liu et al. |
| 2010/0059737 A1* | 3/2010 | Bhuwalka ......... H01L 21/26586 257/E29.072 |
| 2011/0215299 A1 | 9/2011 | Rao |
| 2015/0357414 A1 | 12/2015 | Mears |
| 2016/0149023 A1 | 5/2016 | Mears et al. |
| 2016/0358773 A1 | 12/2016 | Mears et al. |
| 2016/0359005 A1 | 12/2016 | Hu et al. |
| 2018/0175184 A1 | 6/2018 | Then et al. |
| 2019/0058059 A1 | 2/2019 | Stephenson et al. |
| 2019/0189652 A1 | 6/2019 | Chen et al. |
| 2019/0279897 A1 | 9/2019 | Stephenson et al. |

(56) References Cited

U.S. PATENT DOCUMENTS

| | | |
|---|---|---|
| 2019/0317277 A1 | 10/2019 | Stephenson |
| 2019/0319135 A1 | 10/2019 | Stephenson |
| 2019/0319167 A1 | 10/2019 | Stephenson |
| 2020/0135489 A1 | 4/2020 | Weeks et al. |
| 2020/0161430 A1 | 5/2020 | Takeuchi et al. |
| 2020/0343367 A1 | 10/2020 | Takeuchi et al. |
| 2020/0343380 A1 | 10/2020 | Takeuchi et al. |

OTHER PUBLICATIONS

U.S. Appl. No. 16/513,832, filed 17/17/2019; Burton et al. See Priority U.S. Appl. No. 17/305,161, filed Jun. 20, 2021.

U.S. Appl. No. 16/513,875, filed 17/17/2019; Burton et al. See Priority U.S. Appl. No. 17/305,161, filed Jun. 20, 2021.

U.S. Appl. No. 16/513,906, filed 17/17/2019; Burton et al. See Priority U.S. Appl. No. 17/305,161, filed Jun. 20, 2021.

U.S. Appl. No. 16/801,287, filed Feb. 26, 2020; Weeks et al. See Priority U.S. Appl. No. 17/305,161, filed Jun. 20, 2021.

U.S. Appl. No. 16/801,305, filed Feb. 26, 2020; Weeks et al. See Priority U.S. Appl. No. 17/305,161, filed Jun. 20, 2021.

U.S. Appl. No. 16/810,957, filed Mar. 6, 2020; Cody et al. See Priority U.S. Appl. No. 17/305,161, filed Jun. 20, 2021.

U.S. Appl. No. 16/898,564, filed Jun. 11, 2020; Takeuchi et al. See Priority U.S. Appl. No. 17/305,161, filed Jun. 20, 2021.

U.S. Appl. No. 16/898,589, filed Jun. 11, 2020; Takeuchi et al. See Priority U.S. Appl. No. 17/305,161, filed Jun. 20, 2021.

U.S. Appl. No. 16/913,487, filed Jun. 26, 2020; Burton et al. See Priority U.S. Appl. No. 17/305,161, filed Jun. 20, 2021.

U.S. Appl. No. 16/913,546, filed Jun. 26, 2020; Burton Etal See Priority U.S. Appl. No. 17/305,161, filed Jun. 20, 2021.

U.S. Appl. No. 17/020,353, filed Sep. 14, 2020; Weeks et al. See Priority U.S. Appl. No. 17/305,161, filed Jun. 20, 2021.

U.S. Appl. No. 17/101,399, filed Nov. 23, 2020; Stephenson et al. See Priority U.S. Appl. No.17/305,161, filed Jun. 20, 2021.

U.S. Appl. No. 17/236,289, filed Apr. 21, 2021; Hytha et al. See Priority U.S. Appl. No. 17/305,161, filed Jun. 20, 2021.

U.S. Appl. No. 17/236,329, filed Apr. 21, 2021; Hytha et al. See Priority U.S. Appl. No. 17/305,161, filed Jun. 20, 2021.

U.S. Appl. No. 17/305,098, filed Jun. 30, 2021; Weeks et al.; See Priority U.S. Appl. No. 17/305,161, filed Jun. 20, 2021.

U.S. Appl. No. 17/330,831, filed May 26, 2021; Hytha et al. See Priority U.S. Appl. No. 17/305,161, filed Jun. 20, 2021.

U.S. Appl. No. 17/330,860, filed May 26, 2021; Hytha et al. See Priority U.S. Appl. No. 17/305,161, filed Jun. 20, 2021.

Luo et al, "Chemical Design of Direct-Gap Light-Emitting Silicon" published in Physical Review Letters, vol. 89, No. 7; Aug. 12, 2002; 4 pgs. See Priority U.S. Appl. No. 17/305,161, Filed Jun. 20, 2021.

Mears et al. "Simultaneous Carrier Transport Enhancement and variability reduction in Si MOSFETs by insertion of partial Monolayers of oxygen" IEEE silicon Nanoelectronics Workshop (2012): (Date of conference Jun. 10-11, 2012) pp. 2. See Priority U.S. Appl. No. 17/305,161, Filed Jun. 20, 2021.

Novikov et al. "Silicon-based Optoelectronics" 1999-2003, pp. 1-6. See Priority U.S. Appl. No. 17/305,161, Filed Jun. 20, 2021.

R. Tsu "Phenomena in silicon nanostructure device" published online Sep. 6, 2000 by Applied Physics and Materials Science & Processing, pp. 391-402 See Priority U.S. Appl. No. 17/305,161, Filed Jun. 20, 2021.

R. Tsu "Si Based Green ELD: Si-Oxygen Superlattice" ysiwyg://llhttp://www3.interscience.wiley.com/cgi-bin/abstract/72512946/start: published online Jul. 21, 2000; 2 pgs. Abstract Only. See Priority U.S. Appl. No. 17/305,161, Filed Jun. 20, 2021.

Xu et al. "Effectiveness of Quasi-confinement technology for improving P-chanel Si an Ge MOSSFET performance" Department of Electrical Engineering and Computer Science, University of California, Berkeley, 2012, pp. 2. mearstech.net; retrieved from internet Jan. 18, 2016. See Priority U.S. Appl. No. 17/305,161, Filed Jun. 20, 2021.

Xu et al. "Extension of planar bulk n-channel MOSFET scaling with oxygen insertion technology" IEEE Transactions on Electron devices, vol. 61, No. 9; Sep. 2014. pp. 3345-3349. See Priority U.S. Appl. No. 17/305,161, Filed Jun. 20, 2021.

Xu et al., "MOSFET performance and scalability enhancement by insertion of oxygen layers", Department of Electrical Engineering and Computer Science, University of California, Berkeley, 2012, pp. 1-4. See Priority U.S. Appl. No. 17/305,161, Filed Jun. 20, 2021.

Chan et al. "Strain for CMOS performance Improvement" VLSI SYM 2002 https://pdfs.semanticscholar.org/5198/5a888dea152c05edea78836ec5c323871 bdO.pdf pp. 69 See Priority U.S. Appl. No. 17/305,161, Filed Jun. 20, 2021.

Yeo et al. "Strained Channel Transistor Using Strain Field Induced by Source and Drain Stressors" MRS Online Proceedings Library (OPL), 2004; pp. 6 See Priority U.S. Appl. No. 17/305,161, Filed Jun. 20, 2021.

Zhang et al. "High-k metal gate fundamental learning and multi-Vt options for stacked nanosheet gate-all-around transistor" 2017 IEEE International Electron Devices Meeting (IEDM) pp. 4 See Priority U.S. Appl. No. 17/305,161, Filed Jun. 20, 2021.

Kal et al. "Selective isotropic etching of Group IV semiconductors to enable gate all around device architectures" SPCC Apr. 10, 2018; pp. 17 See Priority U.S. Appl. No. 17/305,161, Filed Jun. 20, 2021.

Bauer et al. "Highly tensile strained silicon carbon alloys epitaxially grown into recessed source drain areas of NMOS devices" Semicond. Sci. Technol. 22 (1), S183-S187 (2007), pp. 5 See Priority U.S. Appl. No. 17/305,161, Filed Jun. 20, 2021.

Berti et al. "Lattice parameter in Si12yCy epilayers: Deviation from Vegard™s rule" Appl. Phys. Lett. 72, 1602(1998). pp. 3 See Priority U.S. Appl. No. 17/305,161, Filed Jun. 20, 2021.

P.C. Kelires, "Short-range order, bulk moduli, and physical trends in c-Si12xCx alloys", Phys. Rev. B 55, 8784 (1997), Phys. Rev. Lett. 75, 1114 (1995) pp. 4 See Priority U.S. Appl. No. 17/305,161, Filed Jun. 20, 2021.

Y. C. Yeo, "Silicon-Carbon Source/Drain: Selective Epitaxy, Process Integration, and Transistor Strain Engineering" ECS Transactions, 3 (7), 1143-1150 (2006); pp. 8 See Priority U.S. Appl. No. 17/305,161, Filed Jun. 20, 2021.

\* cited by examiner

METHOD FOR MAKING SEMICONDUCTOR DEVICE INCLUDING SUPERLATTICE WITH OXYGEN AND CARBON MONOLAYERS

RELATED APPLICATIONS

This application is a continuation application of U.S. patent application Ser. No. 17/305,101 filed June 30, 2021, which claims the benefit of U.S. provisional application Ser. No. 63/047,356 filed July 2, 2020, which are hereby incorporated herein in their entireties by reference.

TECHNICAL FIELD

The present disclosure generally relates to semiconductor devices and, more particularly, to semiconductor devices with enhanced semiconductor materials and associated methods.

BACKGROUND

Structures and techniques have been proposed to enhance the performance of semiconductor devices, such as by enhancing the mobility of the charge carriers. For example, U.S. Patent Application No. 2003/0057416 to Currie et al. discloses strained material layers of silicon, silicon-germanium, and relaxed silicon and also including impurity-free zones that would otherwise cause performance degradation. The resulting biaxial strain in the upper silicon layer alters the carrier mobilities enabling higher speed and/or lower power devices. Published U.S. Patent Application No. 2003/0034529 to Fitzgerald et al. discloses a CMOS inverter also based upon similar strained silicon technology.

U.S. Pat. No. 6,472,685 B2 to Takagi discloses a semiconductor device including a silicon and carbon layer sandwiched between silicon layers so that the conduction band and valence band of the second silicon layer receive a tensile strain. Electrons having a smaller effective mass, and which have been induced by an electric field applied to the gate electrode, are confined in the second silicon layer, thus, an n-channel MOSFET is asserted to have a higher mobility.

U.S. Pat. No. 4,937,204 to Ishibashi et al. discloses a superlattice in which a plurality of layers, less than eight monolayers, and containing a fractional or binary or a binary compound semiconductor layer, are alternately and epitaxially grown. The direction of main current flow is perpendicular to the layers of the superlattice.

U.S. Pat. No. 5,357,119 to Wang et al. discloses a Si—Ge short period superlattice with higher mobility achieved by reducing alloy scattering in the superlattice. Along these lines, U.S. Pat. No. 5,683,934 to Candelaria discloses an enhanced mobility MOSFET including a channel layer comprising an alloy of silicon and a second material substitutionally present in the silicon lattice at a percentage that places the channel layer under tensile stress.

U.S. Pat. No. 5,216,262 to Tsu discloses a quantum well structure comprising two barrier regions and a thin epitaxially grown semiconductor layer sandwiched between the barriers. Each barrier region consists of alternate layers of SiO2/Si with a thickness generally in a range of two to six monolayers. A much thicker section of silicon is sandwiched between the barriers.

An article entitled "Phenomena in silicon nanostructure devices" also to Tsu and published online Sep. 6, 2000 by Applied Physics and Materials Science & Processing, pp. 391-402 discloses a semiconductor-atomic superlattice (SAS) of silicon and oxygen. The Si/O superlattice is disclosed as useful in a silicon quantum and light-emitting devices. In particular, a green electroluminescence diode structure was constructed and tested. Current flow in the diode structure is vertical, that is, perpendicular to the layers of the SAS. The disclosed SAS may include semiconductor layers separated by adsorbed species such as oxygen atoms, and CO molecules. The silicon growth beyond the adsorbed monolayer of oxygen is described as epitaxial with a fairly low defect density. One SAS structure included a 1.1 nm thick silicon portion that is about eight atomic layers of silicon, and another structure had twice this thickness of silicon. An article to Luo et al. entitled "Chemical Design of Direct-Gap Light-Emitting Silicon" published in Physical Review Letters, Vol. 89, No. 7 (Aug. 12, 2002) further discusses the light emitting SAS structures of Tsu.

U.S. Pat. No. 7,105,895 to Wang et al. discloses a barrier building block of thin silicon and oxygen, carbon, nitrogen, phosphorous, antimony, arsenic or hydrogen to thereby reduce current flowing vertically through the lattice more than four orders of magnitude. The insulating layer/barrier layer allows for low defect epitaxial silicon to be deposited next to the insulating layer.

Published Great Britain Patent Application 2,347,520 to Mears et al. discloses that principles of Aperiodic Photonic Band-Gap (APBG) structures may be adapted for electronic bandgap engineering. In particular, the application discloses that material parameters, for example, the location of band minima, effective mass, etc., can be tailored to yield new aperiodic materials with desirable band-structure characteristics. Other parameters, such as electrical conductivity, thermal conductivity and dielectric permittivity or magnetic permeability are disclosed as also possible to be designed into the material.

Furthermore, U.S. Pat. No. 6,376,337 to Wang et al. discloses a method for producing an insulating or barrier layer for semiconductor devices which includes depositing a layer of silicon and at least one additional element on the silicon substrate whereby the deposited layer is substantially free of defects such that epitaxial silicon substantially free of defects can be deposited on the deposited layer. Alternatively, a monolayer of one or more elements, preferably comprising oxygen, is absorbed on a silicon substrate. A plurality of insulating layers sandwiched between epitaxial silicon forms a barrier composite.

Despite the existence of such approaches, further enhancements may be desirable for using advanced semiconductor materials and processing techniques to achieve improved performance in semiconductor devices.

SUMMARY

A method for making a semiconductor device may include forming a superlattice adjacent a semiconductor layer. The superlattice may include a plurality of stacked groups of layers, with each group of layers including a plurality of stacked base semiconductor monolayers defining a base semiconductor portion, and at least one non-semiconductor monolayer constrained within a crystal lattice of adjacent base semiconductor portions. The at least one non-semiconductor monolayer in a first group of layers of the superlattice may comprise oxygen and be devoid of carbon, and the at least one non-semiconductor monolayer in a second group of layers of the superlattice may comprise carbon.

In an example embodiment, the second group of layers may be above the first group of layers in the superlattice. In one example implementation, the semiconductor layer may comprise a substrate below the superlattice, and the method may further include forming a strained semiconductor layer above the superlattice. By way of example, the second group of layers of the superlattice may comprise carbon and be devoid of oxygen. In accordance with another example, the second group of layers of the superlattice may comprise carbon and oxygen.

In one example configuration, the method may further include forming source and drain regions on the semiconductor layer and defining a channel in the superlattice, and a gate above the superlattice. In accordance with another example embodiment, the method may further include forming a metal layer above the superlattice. Furthermore, in some embodiments the superlattice may divide the semiconductor layer into a first region and a second region, with the first region having a same conductivity type and a different dopant concentration than the second region. In accordance with another example implementation, the superlattice may divide the semiconductor layer into a first region and a second region, with the first region having a different conductivity type than the second region. By way of example, the base semiconductor layer may comprise silicon.

DETAILED DESCRIPTION

Figure 1:
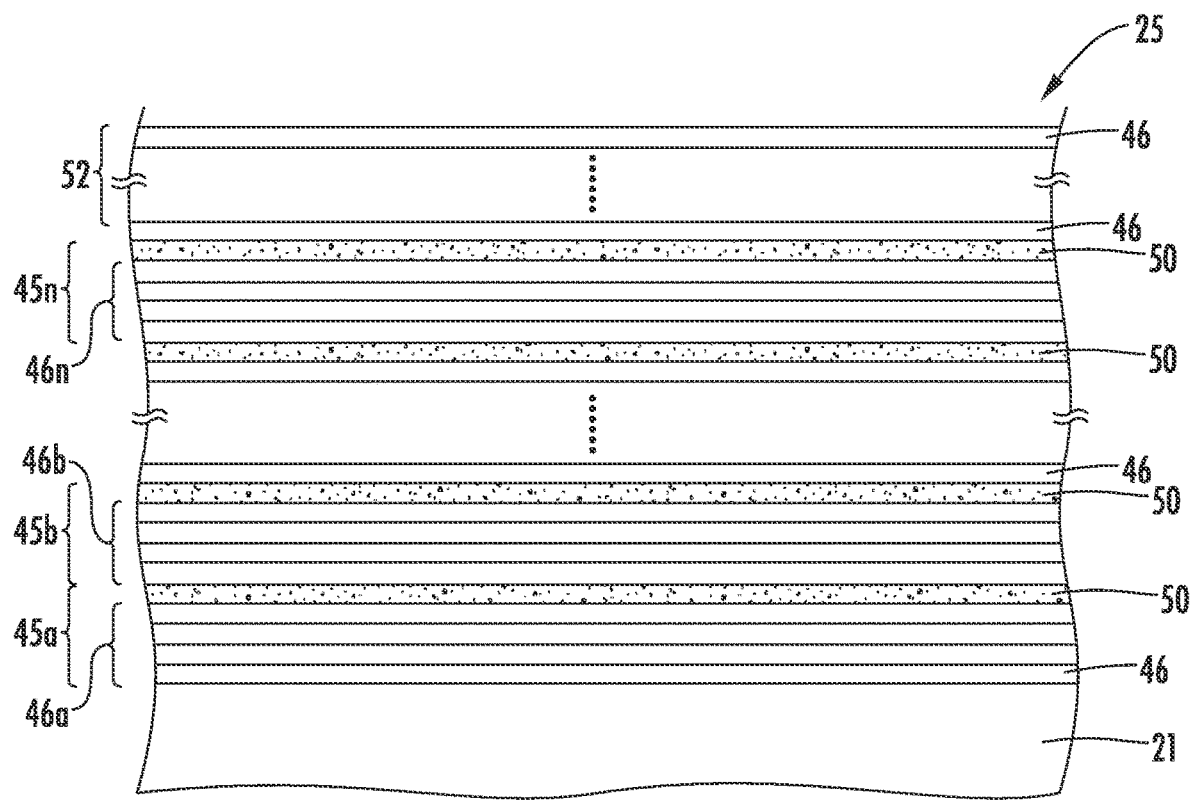
FIG. 1 is a greatly enlarged schematic cross-sectional view of a superlattice for use in a semiconductor device in accordance with an example embodiment.

Example embodiments will now be described more fully hereinafter with reference to the accompanying drawings, in which the example embodiments are shown. The embodiments may, however, be implemented in many different forms and should not be construed as limited to the specific examples set forth herein. Rather, these embodiments are provided so that this disclosure will be thorough and complete. Like numbers refer to like elements throughout, and prime notation is used to indicate similar elements in different embodiments.

Generally speaking, the present disclosure relates to the formation of semiconductor devices utilizing an enhanced semiconductor superlattice. The enhanced semiconductor superlattice may also be referred to as an "MST" layer/film or "MST technology" in this disclosure.

More particularly, the MST technology relates to advanced semiconductor materials such as the superlattice 25 described further below. Applicant theorizes, without wishing to be bound thereto, that certain superlattices as described herein reduce the effective mass of charge carriers and that this thereby leads to higher charge carrier mobility. Effective mass is described with various definitions in the literature. As a measure of the improvement in effective mass Applicant's use a "conductivity reciprocal effective mass tensor", $M_e^{-1}$ and $M_h^{-1}$ for electrons and holes respectively, defined as:

$$M_{e,ij}^{-1}(E_F, T) = \frac{\sum_{E>E_F} \int_{B.Z.} (\nabla_k E(k,n))_i (\nabla_k E(k,n))_j \frac{\partial f(E(k,n), E_F, T)}{\partial E} d^3k}{\sum_{E>E_F} \int_{B.Z.} f(E(k,n), E_F, T) d^3k}$$

for electrons and:

$$M_{h,ij}^{-1}(E_F, T) = \frac{-\sum_{E<E_F} \int_{B.Z.} (\nabla_k E(k,n))_i (\nabla_k E(k,n))_j \frac{\partial f(E(k,n), E_F, T)}{\partial E} d^3k}{\sum_{E<E_F} \int_{B.Z.} (1 - f(E(k,n), E_F, T)) d^3k}$$

for holes, where f is the Fermi-Dirac distribution, $E_F$ is the Fermi energy, T is the temperature, E(k,n) is the energy of an electron in the state corresponding to wave vector k and the $n^{th}$ energy band, the indices i and j refer to Cartesian coordinates x, y and z, the integrals are taken over the Brillouin zone (B.Z.), and the summations are taken over bands with energies above and below the Fermi energy for electrons and holes respectively.

Applicant's definition of the conductivity reciprocal effective mass tensor is such that a tensorial component of the conductivity of the material is greater for greater values of the corresponding component of the conductivity reciprocal effective mass tensor. Again, Applicant theorizes without wishing to be bound thereto that the superlattices described herein set the values of the conductivity reciprocal effective mass tensor so as to enhance the conductive properties of the material, such as typically for a preferred direction of charge carrier transport. The inverse of the appropriate tensor element is referred to as the conductivity effective mass. In other words, to characterize semiconductor material structures, the conductivity effective mass for electrons/holes as described above and calculated in the direction of intended carrier transport is used to distinguish improved materials.

Applicant has identified improved materials or structures for use in semiconductor devices. More specifically, Applicant has identified materials or structures having energy band structures for which the appropriate conductivity effective masses for electrons and/or holes are substantially less than the corresponding values for silicon. In addition to the enhanced mobility characteristics of these structures, they may also be formed or used in such a manner that they provide piezoelectric, pyroelectric, and/or ferroelectric properties that are advantageous for use in a variety of different types of devices, as will be discussed further below.

Figure 2:
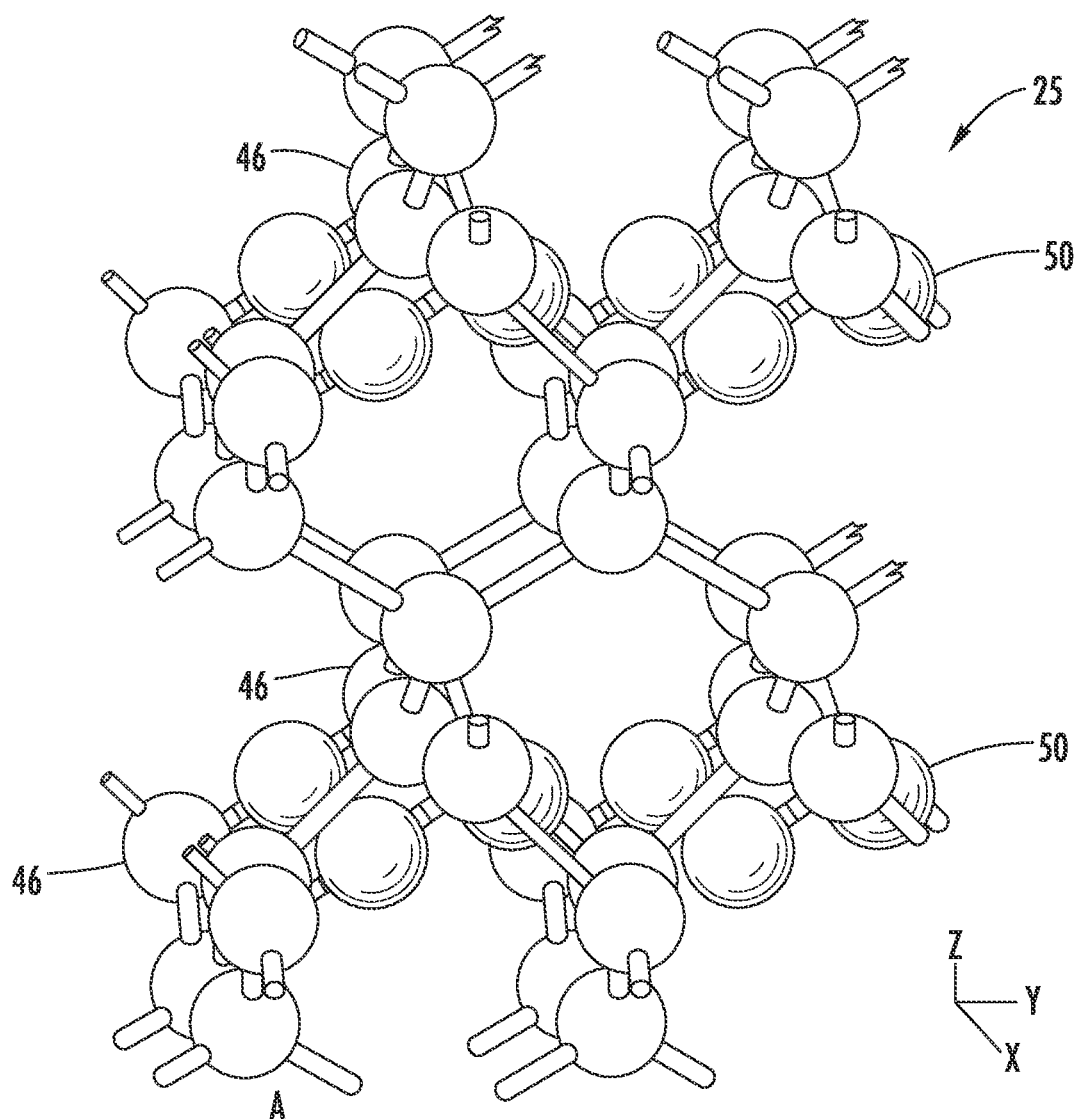
FIG. 2 is a perspective schematic atomic diagram of a portion of the superlattice shown in FIG. 1.

Referring now to FIGS. 1 and 2, the materials or structures are in the form of a superlattice 25 whose structure is controlled at the atomic or molecular level and may be formed using known techniques of atomic or molecular layer deposition. The superlattice 25 includes a plurality of layer groups 45a-45n arranged in stacked relation, as perhaps best understood with specific reference to the schematic cross-sectional view of FIG. 1.

Each group of layers 45a-45n of the superlattice 25 illustratively includes a plurality of stacked base semiconductor monolayers 46 defining a respective base semiconductor portion 46a-46n and an energy band-modifying layer 50 thereon. The energy band-modifying layers 50 are indicated by stippling in FIG. 1 for clarity of illustration.

The energy band-modifying layer 50 illustratively includes one non-semiconductor monolayer constrained within a crystal lattice of adjacent base semiconductor portions. By "constrained within a crystal lattice of adjacent base semiconductor portions" it is meant that at least some semiconductor atoms from opposing base semiconductor portions 46a-46n are chemically bound together through the non-semiconductor monolayer 50 therebetween, as seen in FIG. 2. Generally speaking, this configuration is made possible by controlling the amount of non-semiconductor material that is deposited on semiconductor portions 46a-46n through atomic layer deposition techniques so that not all (i.e., less than full or 100% coverage) of the available semiconductor bonding sites are populated with bonds to non-semiconductor atoms, as will be discussed further below. Thus, as further monolayers 46 of semiconductor material are deposited on or over a non-semiconductor monolayer 50, the newly deposited semiconductor atoms will populate the remaining vacant bonding sites of the semiconductor atoms below the non-semiconductor monolayer.

In other embodiments, more than one such non-semiconductor monolayer may be possible. It should be noted that reference herein to a non-semiconductor or semiconductor monolayer means that the material used for the monolayer would be a non-semiconductor or semiconductor if formed in bulk. That is, a single monolayer of a material, such as silicon, may not necessarily exhibit the same properties that it would if formed in bulk or in a relatively thick layer, as will be appreciated by those skilled in the art.

Applicant theorizes without wishing to be bound thereto that energy band-modifying layers 50 and adjacent base semiconductor portions 46a-46n cause the superlattice 25 to have a lower appropriate conductivity effective mass for the charge carriers in the parallel layer direction than would otherwise be present. Considered another way, this parallel direction is orthogonal to the stacking direction. The band modifying layers 50 may also cause the superlattice 25 to have a common energy band structure, while also advantageously functioning as an insulator between layers or regions vertically above and below the superlattice.

Moreover, this superlattice structure may also advantageously act as a barrier to dopant and/or material diffusion between layers vertically above and below the superlattice 25. These properties may thus advantageously allow the superlattice 25 to provide an interface for high-K dielectrics which not only reduces diffusion of the high-K material into the channel region, but which may also advantageously reduce unwanted scattering effects and improve device mobility, as will be appreciated by those skilled in the art.

It is also theorized that semiconductor devices including the superlattice 25 may enjoy a higher charge carrier mobility based upon the lower conductivity effective mass than would otherwise be present. In some embodiments, and as a result of the band engineering achieved by the present invention, the superlattice 25 may further have a substantially direct energy bandgap that may be particularly advantageous for opto-electronic devices, for example.

The superlattice 25 also illustratively includes a cap layer 52 on an upper layer group 45n. The cap layer 52 may comprise a plurality of base semiconductor monolayers 46. By way of example, the cap layer 52 may have between 1 to 100 monolayers 46 of the base semiconductor, and, more preferably between 10 to 50 monolayers. However, in some applications the cap layer 52 may be omitted, or thicknesses greater than 100 monolayers may be used.

Each base semiconductor portion 46a-46n may comprise a base semiconductor selected from the group consisting of Group IV semiconductors, Group III-V semiconductors, and Group II-VI semiconductors. Of course, the term Group IV semiconductors also includes Group IV-IV semiconductors, as will be appreciated by those skilled in the art. More particularly, the base semiconductor may comprise at least one of silicon and germanium, for example.

Each energy band-modifying layer 50 may comprise a non-semiconductor selected from the group consisting of oxygen, nitrogen, fluorine, carbon and carbon-oxygen, for example. The non-semiconductor is also desirably thermally stable through deposition of a next layer to thereby facilitate manufacturing. In other embodiments, the non-semiconductor may be another inorganic or organic element or compound that is compatible with the given semiconductor processing as will be appreciated by those skilled in the art. More particularly, the base semiconductor may comprise at least one of silicon and germanium, for example.

It should be noted that the term monolayer is meant to include a single atomic layer and also a single molecular layer. It is also noted that the energy band-modifying layer 50 provided by a single monolayer is also meant to include a monolayer wherein not all of the possible sites are occupied (i.e., there is less than full or 100% coverage). For example, with particular reference to the atomic diagram of FIG. 2, a 4/1 repeating structure is illustrated for silicon as the base semiconductor material, and oxygen as the energy band-modifying material. Only half of the possible sites for oxygen are occupied in the illustrated example.

In other embodiments and/or with different materials this one-half occupation would not necessarily be the case as will be appreciated by those skilled in the art. Indeed, it can be seen even in this schematic diagram, that individual atoms of oxygen in a given monolayer are not precisely aligned along a flat plane as will also be appreciated by those of skill in the art of atomic deposition. By way of example, a preferred occupation range is from about one-eighth to one-half of the possible oxygen sites being full, although other numbers may be used in certain embodiments.

Silicon and oxygen are currently widely used in conventional semiconductor processing, and, hence, manufacturers will be readily able to use these materials as described herein. Atomic or monolayer deposition is also now widely used. Accordingly, semiconductor devices incorporating the superlattice 25 in accordance with the invention may be readily adopted and implemented, as will be appreciated by those skilled in the art.

It is theorized without Applicant wishing to be bound thereto that for a superlattice, such as the Si/O superlattice, for example, that the number of silicon monolayers should desirably be seven or less so that the energy band of the superlattice is common or relatively uniform throughout to achieve the desired advantages. The 4/1 repeating structure shown in FIGS. 1 and 2, for Si/O has been modeled to indicate an enhanced mobility for electrons and holes in the X direction. For example, the calculated conductivity effective mass for electrons (isotropic for bulk silicon) is 0.26 and for the 4/1 SiO superlattice in the X direction it is 0.12 resulting in a ratio of 0.46. Similarly, the calculation for holes yields values of 0.36 for bulk silicon and 0.16 for the 4/1 Si/O superlattice resulting in a ratio of 0.44.

While such a directionally preferential feature may be desired in certain semiconductor devices, other devices may benefit from a more uniform increase in mobility in any direction parallel to the groups of layers. It may also be beneficial to have an increased mobility for both electrons and holes, or just one of these types of charge carriers as will be appreciated by those skilled in the art.

The lower conductivity effective mass for the 4/1 Si/O embodiment of the superlattice 25 may be less than two-thirds the conductivity effective mass than would otherwise occur, and this applies for both electrons and holes. Of course, the superlattice 25 may further comprise at least one type of conductivity dopant therein, as will also be appreciated by those skilled in the art.

Figure 3:
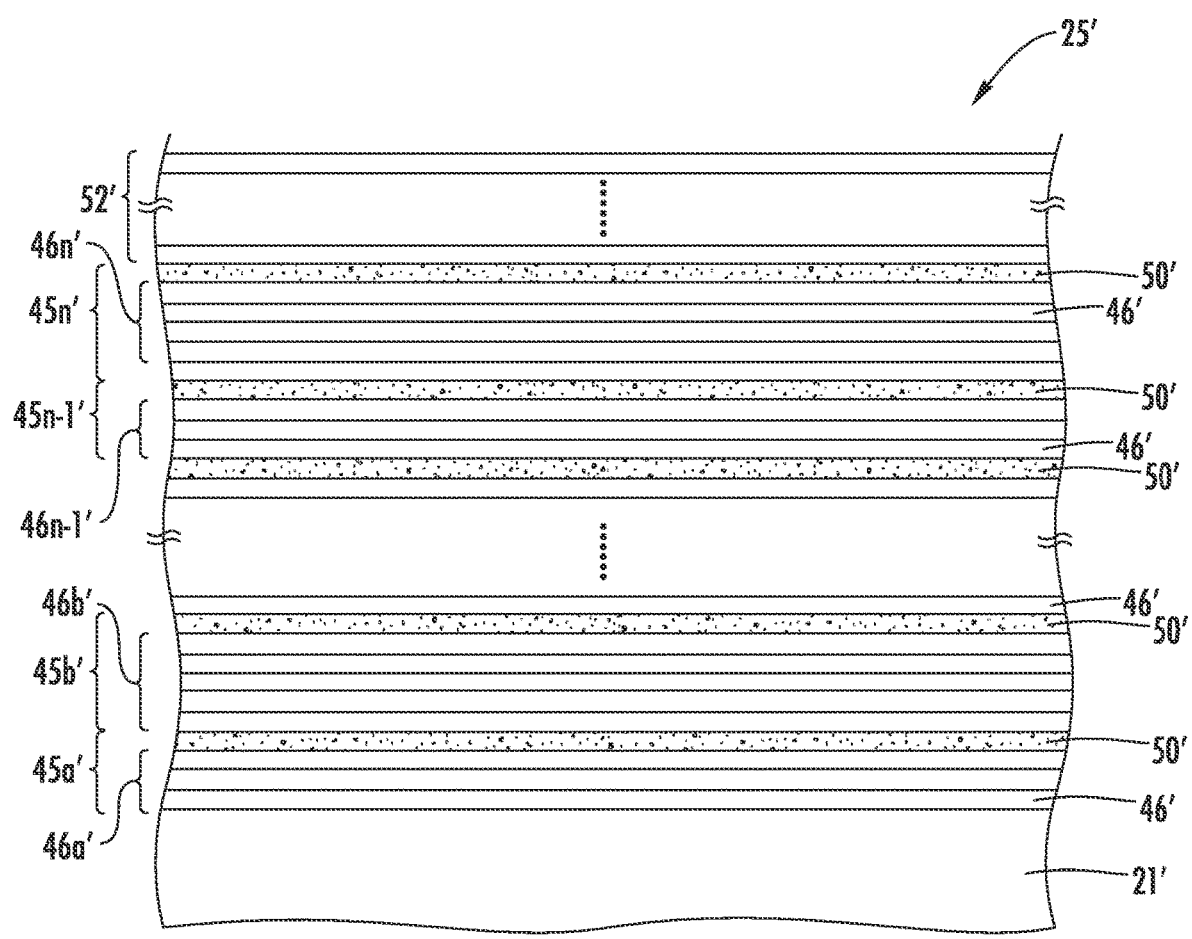
FIG. 3 is a greatly enlarged schematic cross-sectional view of another embodiment of a superlattice in accordance with an example embodiment.

Indeed, referring now additionally to FIG. 3, another embodiment of a superlattice 25' in accordance with the invention having different properties is now described. In this embodiment, a repeating pattern of 3/1/5/1 is illustrated. More particularly, the lowest base semiconductor portion 46a' has three monolayers, and the second lowest base semiconductor portion 46b' has five monolayers. This pattern repeats throughout the superlattice 25'. The energy band-modifying layers 50' may each include a single monolayer. For such a superlattice 25' including Si/O, the enhancement of charge carrier mobility is independent of orientation in the plane of the layers. Those other elements of FIG. 3 not specifically mentioned are similar to those discussed above with reference to FIG. 1 and need no further discussion herein.

In some device embodiments, all of the base semiconductor portions of a superlattice may be a same number of monolayers thick. In other embodiments, at least some of the base semiconductor portions may be a different number of monolayers thick. In still other embodiments, all of the base semiconductor portions may be a different number of monolayers thick.

Figure 4A:
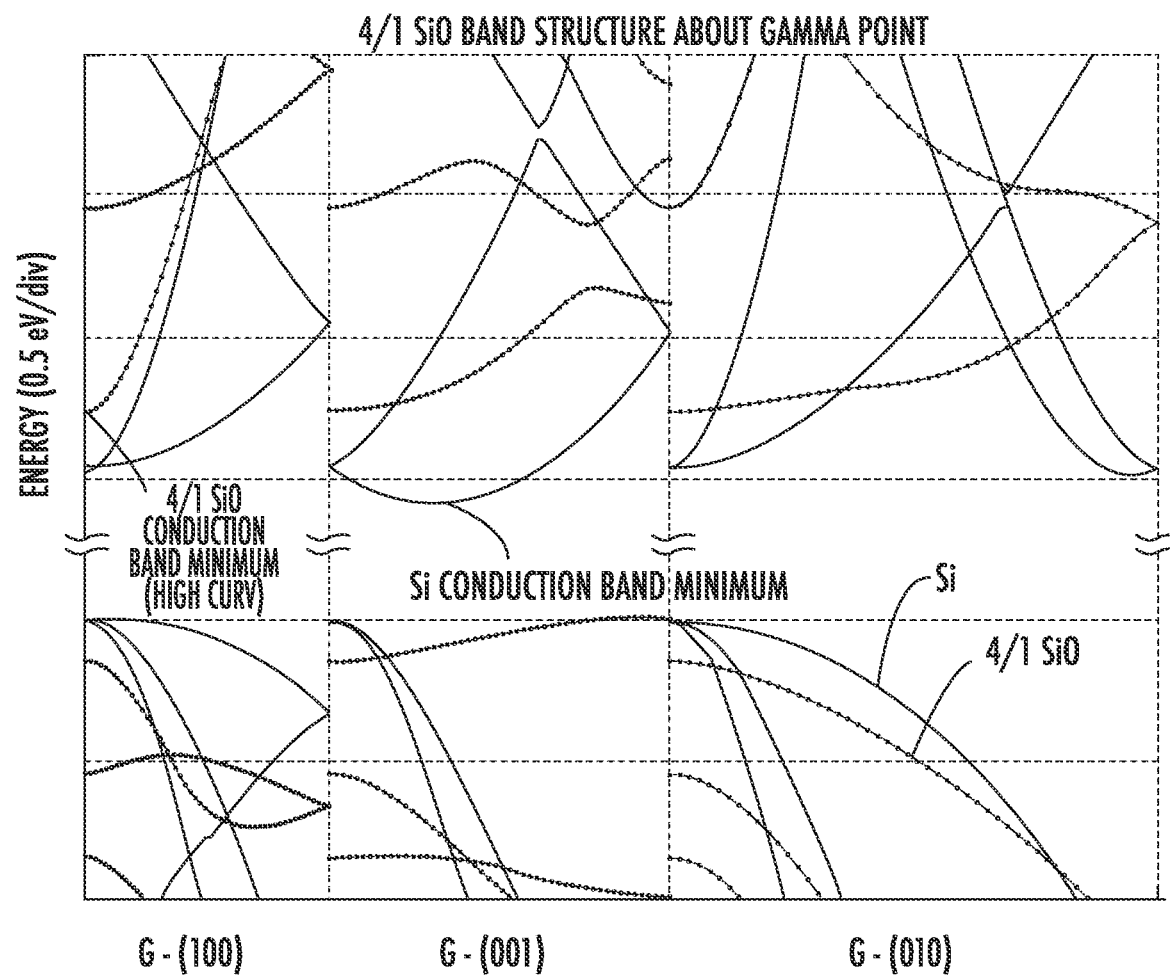
FIG. 4A is a graph of the calculated band structure from the gamma point (G) for both bulk silicon as in the prior art, and for the 4/1 Si/O superlattice as shown in FIGS. 1-2.
Figure 4B:
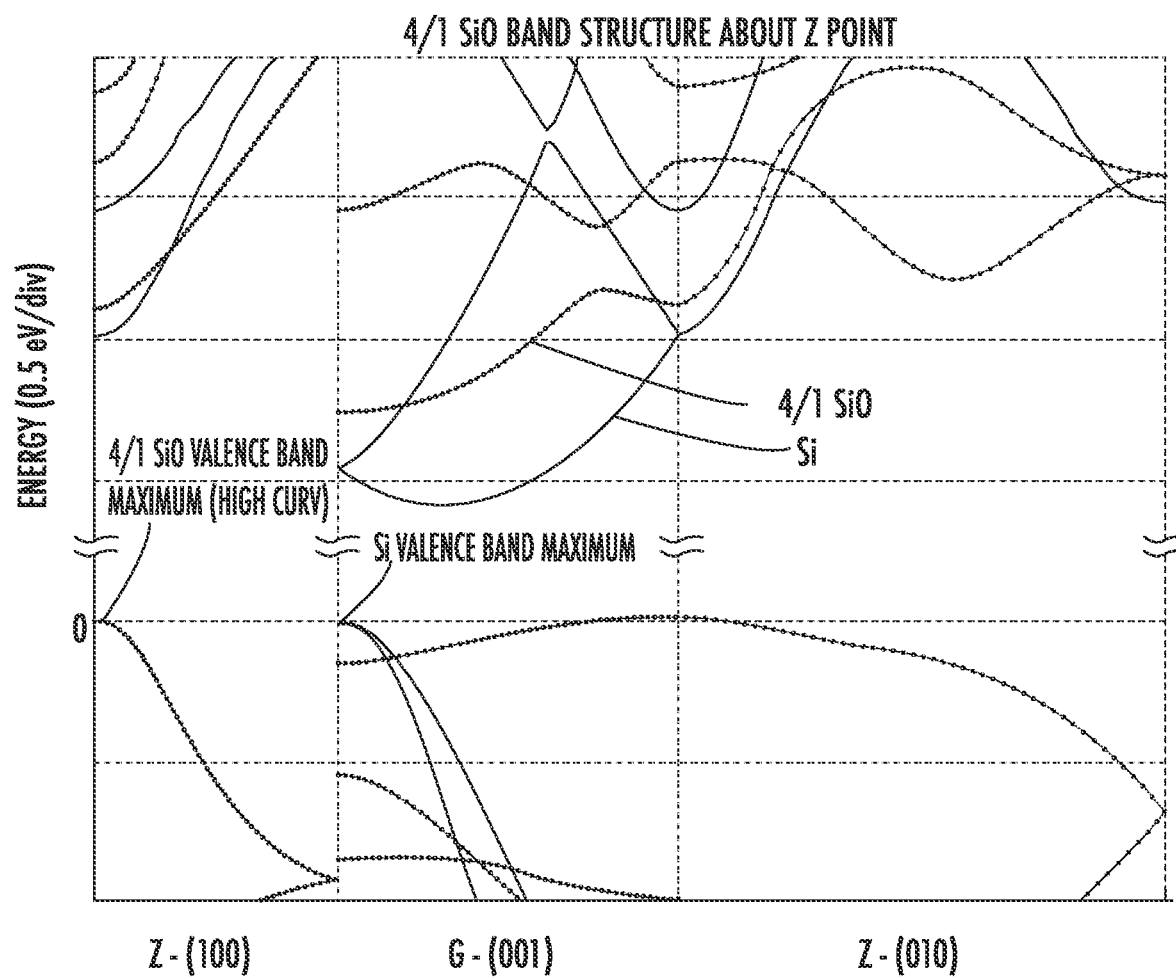
FIG. 4B is a graph of the calculated band structure from the Z point for both bulk silicon as in the prior art, and for the 4/1 Si/O superlattice as shown in FIGS. 1-2.
Figure 4C:
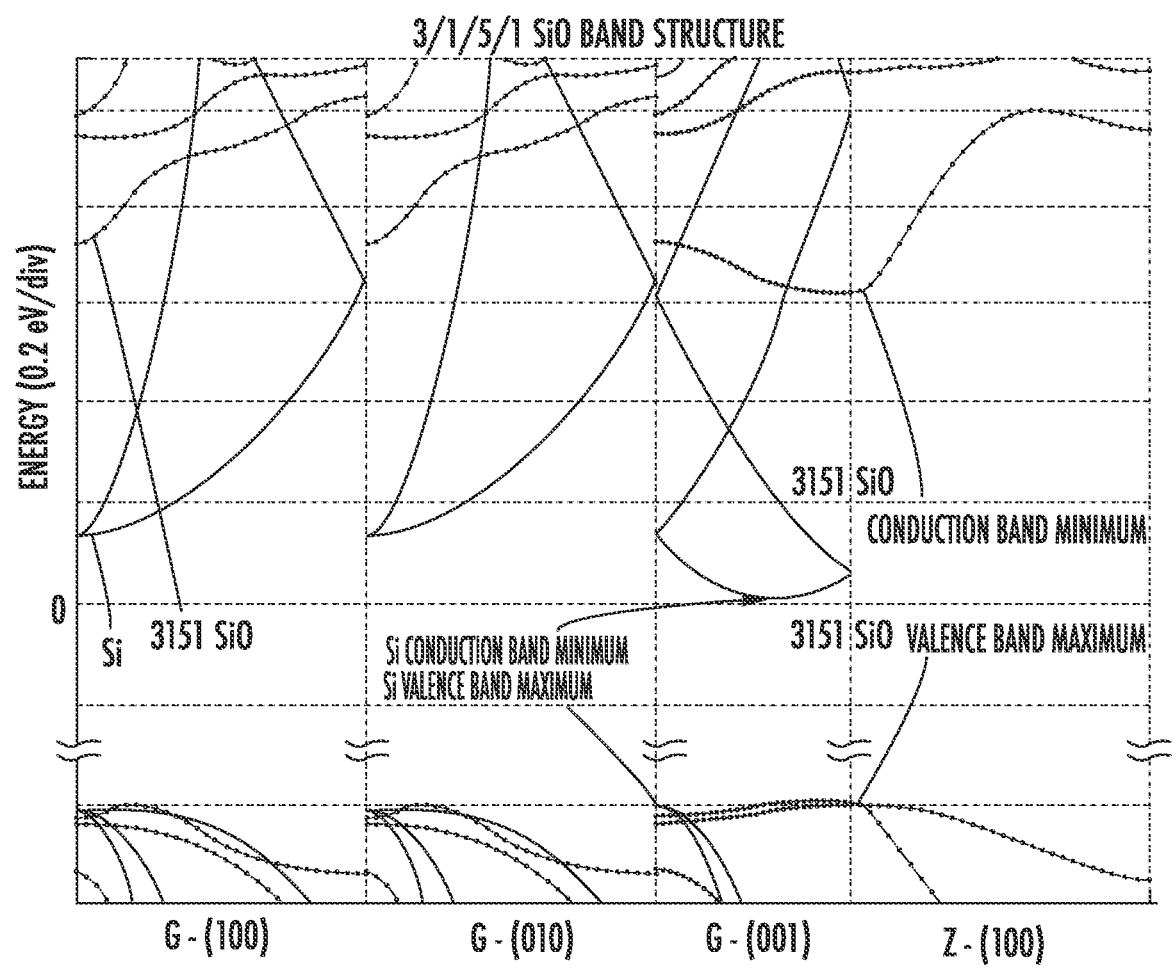
FIG. 4C is a graph of the calculated band structure from both the gamma and Z points for both bulk silicon as in the prior art, and for the 5/1/3/1 Si/O superlattice as shown in FIG. 3.

In FIGS. 4A-4C, band structures calculated using Density Functional Theory (DFT) are presented. It is well known in the art that DFT underestimates the absolute value of the bandgap. Hence all bands above the gap may be shifted by an appropriate "scissors correction." However, the shape of the band is known to be much more reliable. The vertical energy axes should be interpreted in this light.

FIG. 4A shows the calculated band structure from the gamma point (G) for both bulk silicon (represented by continuous lines) and for the 4/1 Si/O superlattice 25 shown in FIG. 1 (represented by dotted lines). The directions refer to the unit cell of the 4/1 Si/O structure and not to the conventional unit cell of Si, although the (001) direction in the figure does correspond to the (001) direction of the conventional unit cell of Si, and, hence, shows the expected location of the Si conduction band minimum. The (100) and (010) directions in the figure correspond to the (110) and (-110) directions of the conventional Si unit cell. Those skilled in the art will appreciate that the bands of Si on the figure are folded to represent them on the appropriate reciprocal lattice directions for the 4/1 Si/O structure.

It can be seen that the conduction band minimum for the 4/1 Si/O structure is located at the gamma point in contrast to bulk silicon (Si), whereas the valence band minimum occurs at the edge of the Brillouin zone in the (001) direction which we refer to as the Z point. One may also note the greater curvature of the conduction band minimum for the 4/1 Si/O structure compared to the curvature of the conduction band minimum for Si owing to the band splitting due to the perturbation introduced by the additional oxygen layer.

FIG. 4B shows the calculated band structure from the Z point for both bulk silicon (continuous lines) and for the 4/1 Si/O superlattice 25 (dotted lines). This figure illustrates the enhanced curvature of the valence band in the (100) direction.

FIG. 4C shows the calculated band structure from both the gamma and Z point for both bulk silicon (continuous lines) and for the 5/1/3/1 Si/O structure of the superlattice 25' of FIG. 3 (dotted lines). Due to the symmetry of the 5/1/3/1 Si/O structure, the calculated band structures in the (100) and (010) directions are equivalent. Thus, the conductivity effective mass and mobility are expected to be isotropic in the plane parallel to the layers, i.e. perpendicular to the (001) stacking direction. Note that in the 5/1/3/1 Si/O example the conduction band minimum and the valence band maximum are both at or close to the Z point.

Although increased curvature is an indication of reduced effective mass, the appropriate comparison and discrimination may be made via the conductivity reciprocal effective mass tensor calculation. This leads Applicant to further theorize that the 5/1/3/1 superlattice 25' should be substantially direct bandgap. As will be understood by those skilled in the art, the appropriate matrix element for optical transition is another indicator of the distinction between direct and indirect bandgap behavior.

Figure 5:
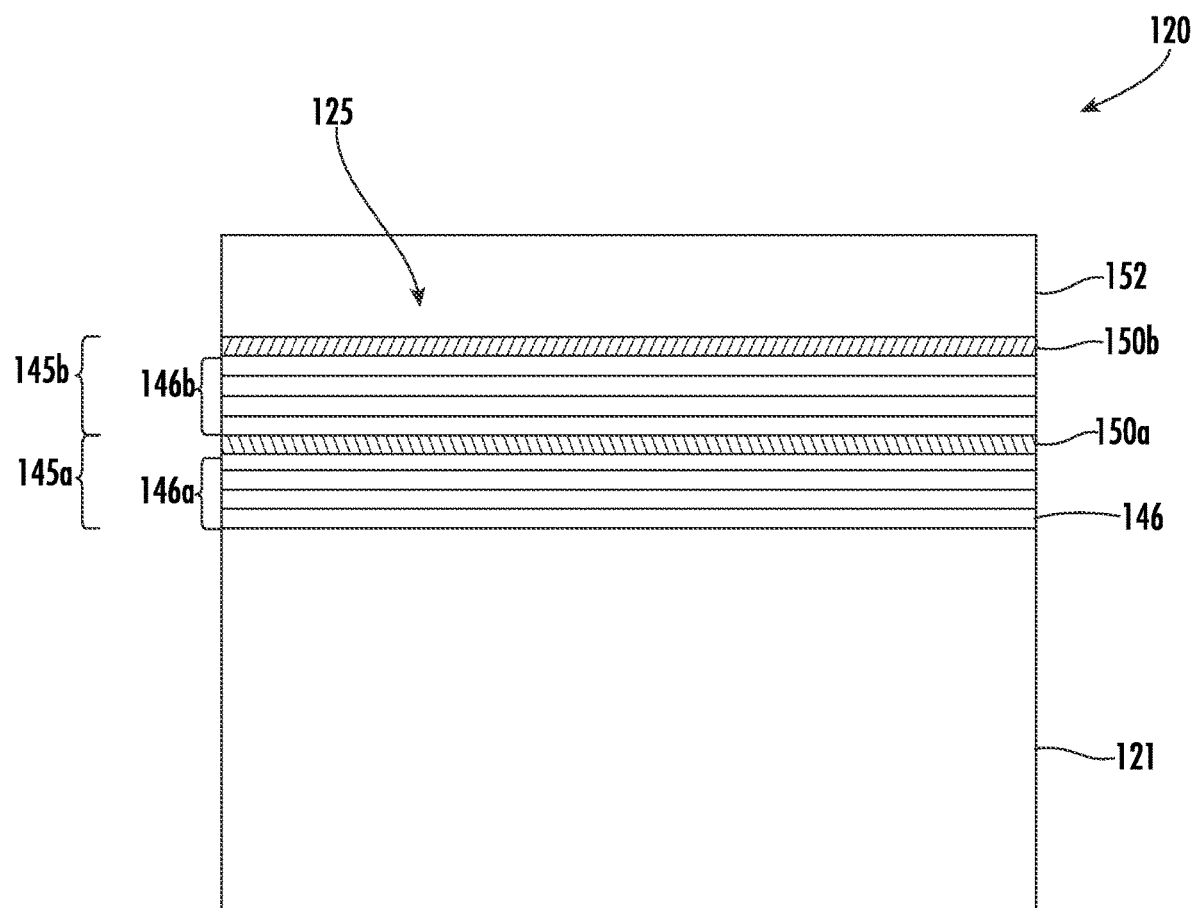
FIG. 5 is a schematic cross-sectional view of a semiconductor device including a superlattice with carbon and oxygen monolayers in accordance with an example embodiment.

Turning now to FIG. 5, using the above-described techniques, advanced semiconductor devices may be fabricated with an MST layer(s) that incorporates different types of non-semiconductor materials therein, such as oxygen and carbon/carbon-oxygen. In the present example, a semiconductor device 120 illustratively includes a semiconductor layer 121 (e.g., a substrate) and a superlattice 125 adjacent the semiconductor layer. As discussed further above, the superlattice 125 includes a plurality of stacked groups of layers 145a-145b, with each group of layers including a plurality of stacked base semiconductor (e.g., silicon) monolayers 146 defining a base semiconductor portion 146a-146b, and a respective non-semiconductor monolayers 150a, 150b for each group which are constrained within a crystal lattice of adjacent base semiconductor portions.

More particularly, the non-semiconductor monolayer(s) 150a in the first group of layers 145a comprises oxygen and is devoid of carbon, and the non-semiconductor monolayer(s) 150b in the second group of layers 145b comprises carbon, e.g., a fully carbon monolayer(s) or a carbon-oxygen monolayer(s). As will be discussed further below, the inclusion of carbon may advantageously provide higher stability for the oxygen within the superlattice (in terms of migration during thermal treatment), yet in an arrangement that positions the carbon away from critical interfaces (e.g., a gate interface) where the carbon may otherwise cause performance issues. It should be noted that while a 4/1 pattern with two groups of layers 145a, 145b is shown in the example of FIG. 5, other group/layer configurations may also be used in different embodiments, as discussed above. Moreover, the order in which the oxygen and carbon/carbon-oxygen monolayers are positioned may also be different in different embodiments, and there need not be equal numbers of oxygen and carbon/carbon-oxygen monolayers in the superlattice 125 in all embodiments.

By way of background, chemical vapor deposition (CVD) silicon carbon alloy growth has been deposited in the past by flowing a carbon source such as $SiH_3CH_3$ (Mono Methyl Silane) mixed with a silicon source such as silane ($SiH_4$), Di-Silane ($Si_2H_6$), Tri-Silane ($Si_3H_8$), or dichlorosilane ($SiH_2Cl_2$). These carbon and silicon sources may be in a diluted mixture or un-diluted. Diluents may include Hydrogen ($H_2$), Nitrogen ($N_2$), Argon (Ar), or Helium (He), for example. During reduced pressure (RP) CVD, the above silicon and carbon sources are further diluted with a carrier gas, such as $H_2$, $N_2$, Ar, or He, for example. The mixture of gases are flowed over a heated substrate causing the reactant molecules to react and deposit on the substrate forming an epitaxial layer. In other words, the elements are delivered in a common gas stream to the substrate. Other techniques such as low-pressure CVD (generally less than 1 torr to 1 millitorr), which is generally the pressure at which a modern vertical furnace would operate, or UHV CVD (10 millitorr to $10^{-9}$ torr) are also used. MOCVD would be an example of another process for creating epitaxial SiC.

The foregoing approaches may all be used to run a "pulsed dose" approach to fabricating MST films including oxygen and carbon/carbon-oxygen monolayers in the superlattice. By "pulsed dose" it is meant that for each non-semiconductor monolayer fabrication, a different type of gas source is briefly flowed to create either the oxygen or carbon/carbon-oxygen monolayer(s) 50 of the respective group of layers 45a-45n. In one example approach, the process may begin with dosing the starting surface with a carbon source such as Propene ($C_3H_6$), for example, as compared to the traditional method of co-flowing the carbon source with the silicon source. Carbon sources that include carbon and other elements that are lost/leave and do not significantly incorporate in the MST film may be used. Such other elements may include hydrogen, chlorine, and Florine, for example. Cyclopropane is another example source for pulsed dose epitaxy, since cyclopropane is a molecule including only carbon and hydrogen. Precursors such as Freon ($CCl_3F_2$) and Chlorodifluoromethane ($CF_3CFCH_2$) are also potential carbon sources for pulsed dose growth. In this case, the fluorine and chlorine would predominately leave as byproducts with the carbon remaining in the film.

Methyl Silane ($SiH_3CH_3$) is an example of another potential source for pulsed dose epitaxy. This gas is commonly used for epitaxial silicon carbon, but the silicon atom in the molecule can deposit during the reaction, disrupting the subsurface exchange mechanism that is desired for pulsed dosed MST film fabrication.

The surface dosing process may be performed such that the carbon atoms that are absorbed are not at such a high surface density, such that epitaxy is not disrupted once the silicon source is flowed for silicon growth after the dosing process. Furthermore, many of the carbon atoms that were dosed on the surface likely undergo an exchange mechanism with subsurface silicon atoms prior to the silicon growth. This subsurface exchange would be similar to what happens while creating an MST oxygen interface layer. These carbon and silicon sources can be in a diluted or un-diluted mixture. Diluents may include Hydrogen ($H_2$), Nitrogen ($N_2$), Argon (Ar), or Helium (He), for example. Hydrogen gas is desirable since carbon atoms that come in contact with a hydrogen terminated silicon surface are likely to be incorporated into the subsurface versus on the surface where the carbon can form clusters that may otherwise disrupt epitaxy.

Figure 6:
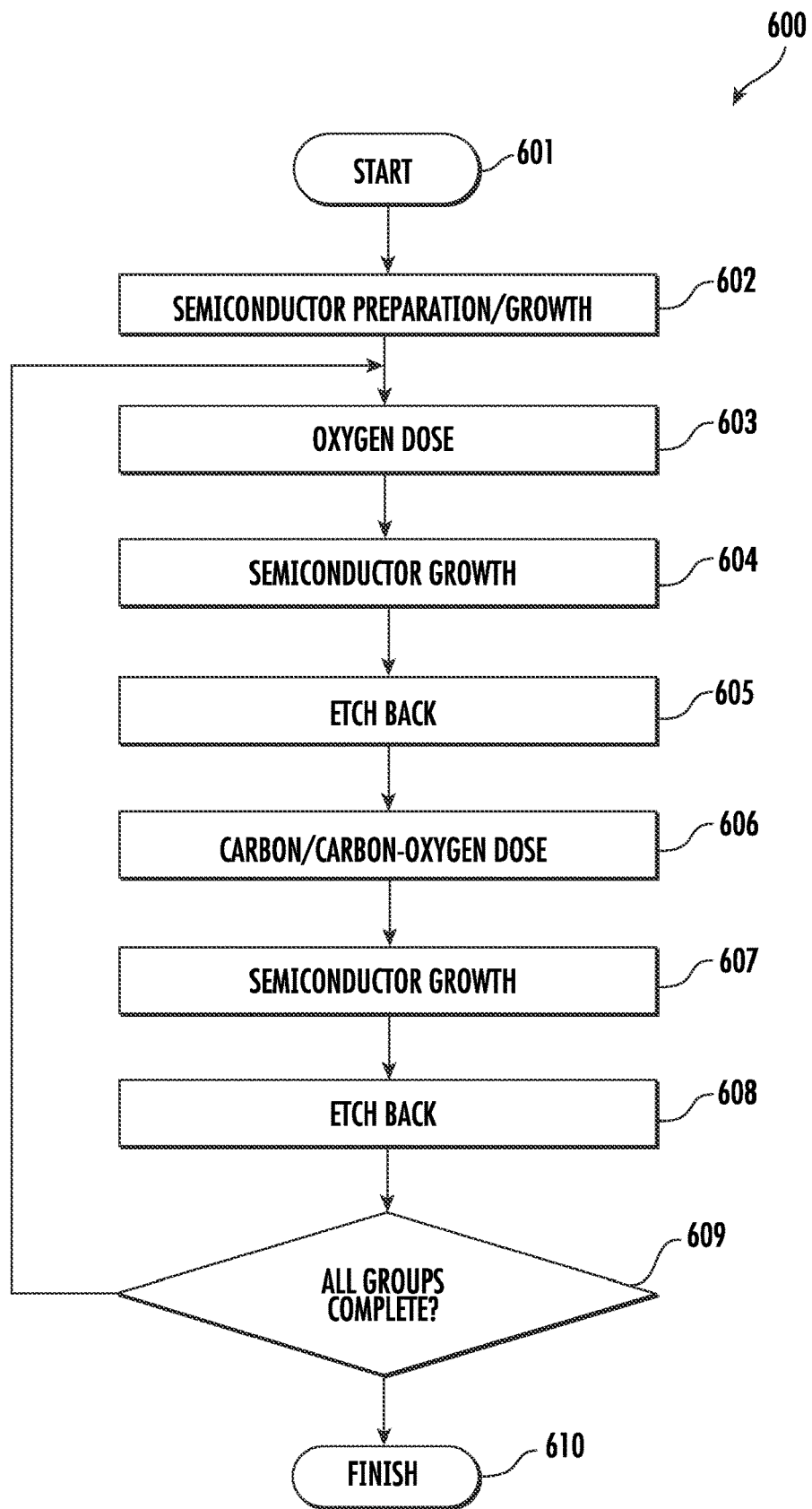
FIG. 6 is a flow diagram illustrating an example method for making the semiconductor device of FIG. 5.
Figure 7:
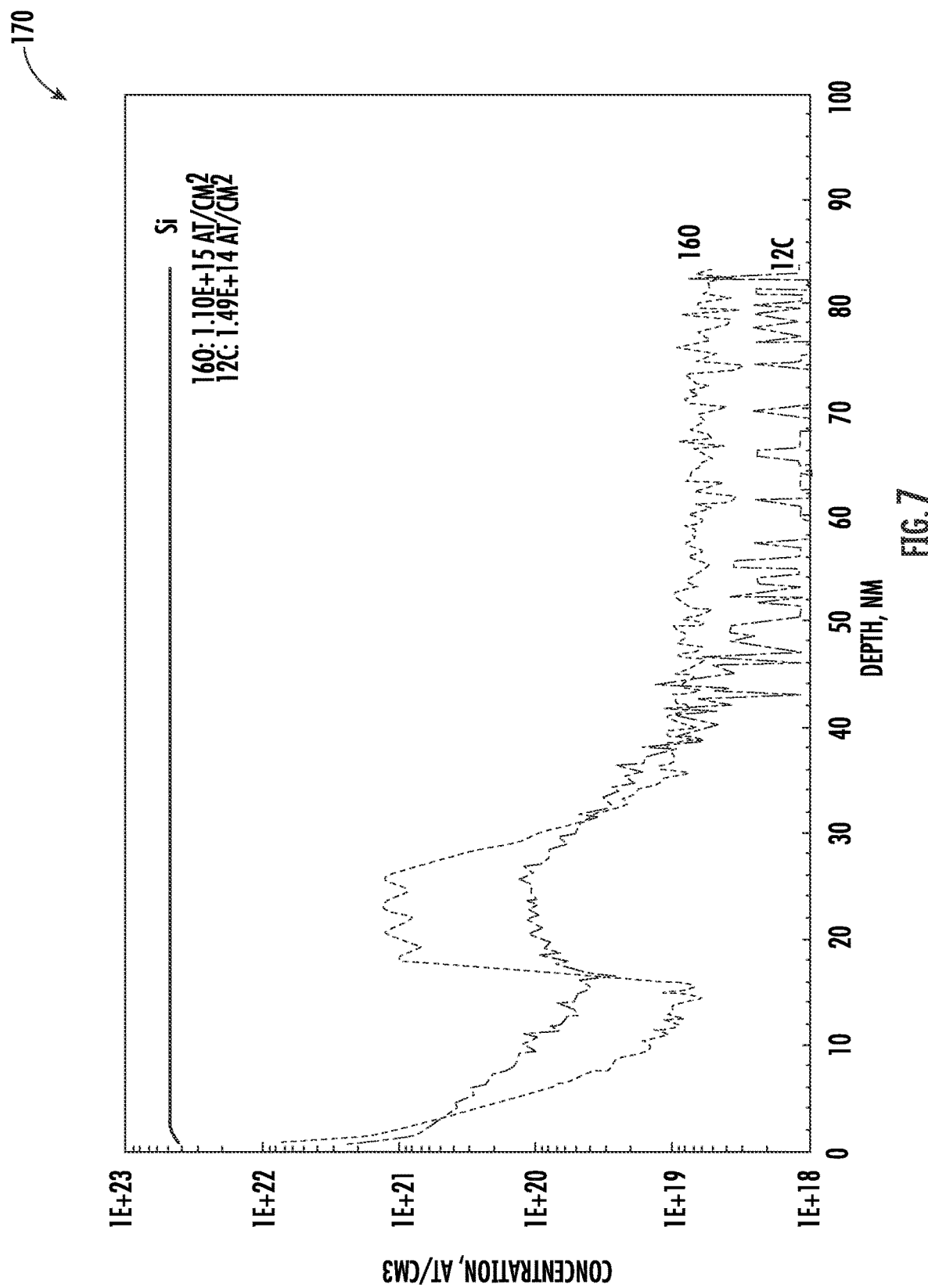
FIGS. 7-10 are secondary ion mass spectroscopy (SIMS) diagrams for different fabrication runs of the semiconductor device of FIG. 5.
Figure 8:
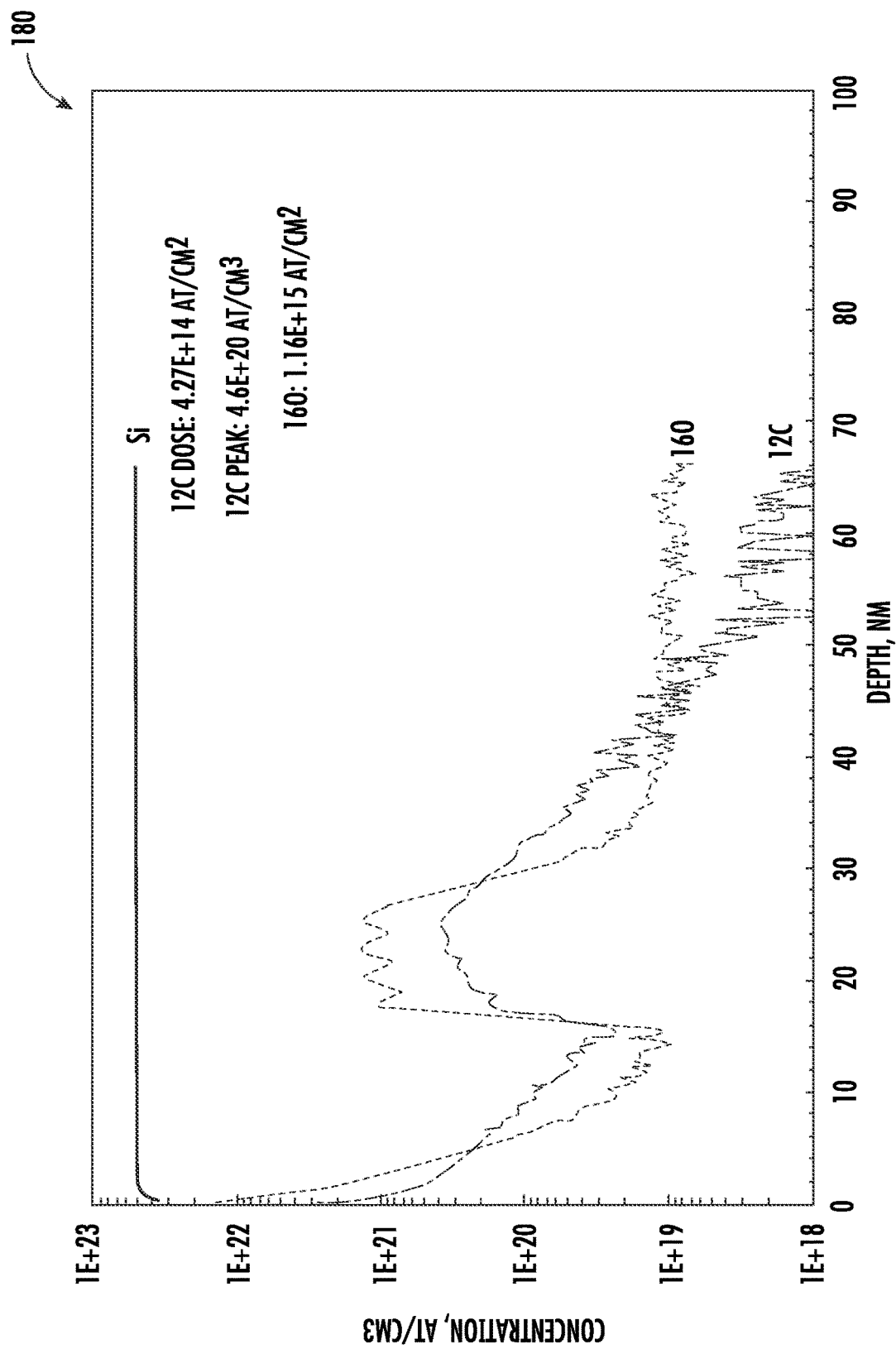
Figure 9:
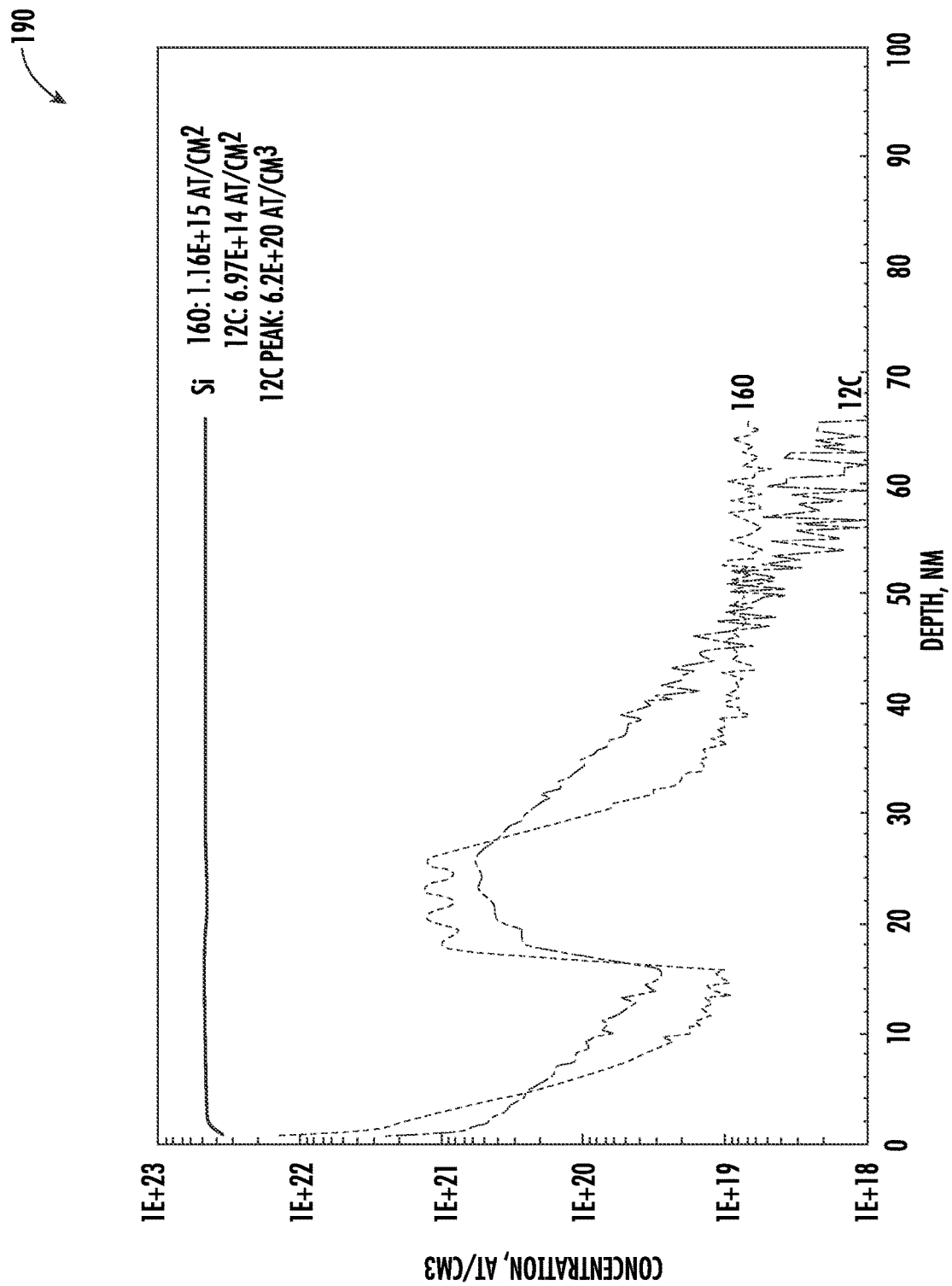

Referring additionally to the flow diagram 600 of FIG. 6, an example pulsed dose approach for fabricating the superlattice 120 is now described. The process begins (Block 601) with the preparation of the substrate 121 (e.g., silicon) for epitaxial growth, at Block 602. The substrate 121 wafer preparation may include a hydrofluoric acid (HF) wet clean followed by a relatively low temperature (e.g., 700° C. to 900° C.) $H_2$ bake in the process chamber. Other preparation steps may include a relatively high temperature $H_2$ bake (on the order of 1000° C. or greater) in the reactor, and substrate surface preparation in a pre-clean module, as will be appreciated by those skilled in the art.

The substrate 121 may be stabilized at the desired dosing conditions, and the initial base silicon portion 146a may be epitaxially formed and dosed with an oxygen source, at Block 603. In other embodiments, an upper portion of the substrate 121 may serve as the base silicon portion 146a, which is dosed with the oxygen source to form the oxygen monolayer(s) 150a. Dosing time and temperature is preferably selected such that the oxygen atoms undergo an exchange with the subsurface, and oxygen that remains at the surface is of a density not so high as to prevent the epitaxial silicon growth that will follow, as discussed further above.

The oxygen surface dosing is followed by a silicon growth step to form the base silicon portion 146b, at Block 604. Between 1 and 100 angstroms of silicon is grown on/over the oxygen dosed surface, for example. The silicon grown may be between 5 and 40 A, for example, although other dimensions may also be used in different embodiments. Example silicon sources include $Si_2H_6$, $Si_3H_8$, $SiCl_2H_2$, or $SiHCl_3$.

The silicon growth may optionally be followed by an etch cycle (Block 605), such as but not limited to hydrochloric acid (HCl). Other etchants may also be used, such as chlorine ($Cl_2$) or $NF_3$, for example. This etch step is used to condition out any defects that may have been induced during the growth or carbon dosing step. This etch step is designed in such a way as to have higher etch rates of amorphous, poly crystalline, and/or dislocated silicon than single crystal epitaxy. Etch removal per cycle may be any amount less than the deposited silicon thickness. For example, the etched amount may be 20 to 30 percent of the deposited silicon layer when the initial silicon deposited layer is on the order of 25 Å and 35 Å thick. Further details regarding etch-back processing to fabricate superlattices with reduced defects may be found in U.S. Pat. Nos. 10,566,191 and 10,811,498 to Weeks et al., which are assigned to the present Applicant and hereby incorporated herein in their entireties by reference.

The substrate 121 may then be stabilized at the desired dosing conditions, and the silicon surface dosed with a carbon source (or a carbon-oxygen source for a carbon-oxygen monolayer 150b) as described previously, at Block 606. As noted above, the dosing time and temperature may be selected such that the carbon (or carbon-oxygen) atoms undergo an exchange with the silicon subsurface, yet carbon (or carbon-oxygen) that remains at the surface is of a density not so high as to prevent the epitaxial silicon growth that will follow.

Further epitaxial silicon growth and etch back may then be performed (Blocks 607-608) to grow the cap layer 152 or an additional base semiconductor portion, depending on how many groups of layers are to be included in the superlattice 120 (Block 609). The method of FIG. 6 illustratively concludes at Block 610, although additional semiconductor processing steps may thereafter be performed to fabricate various types of semiconductor devices, examples of which will be discussed further below.

There are various ways in which oxygen and carbon layers can be interlaced. For example, the oxygen and carbon source may dose a silicon layer during the same pulse for carbon-oxygen monolayers. In accordance with another example, the oxygen may be first, followed by a carbon pulse, or vise-versa. As noted above, example silicon separation thicknesses between the monolayers 150a, 150b may be in a range of 5 Å to 50 Å, although other thicknesses may be used in some embodiments.

By way of example, pulsed dosed carbon incorporation may be performed over a temperature range of 100° C. to 1400° C., and more particularly 300° C. and 900° C. At temperatures below 600° C., a co-flowed silicon carbon layer will predominantly be incorporated into the silicon lattice on substitutional sites. At temperatures above 600° C., some of the carbon in the MST film will be substitutional, some will be interstitial, and possibly some as silicon carbide precipitates (at temperatures closer to 800° C.). The amount of carbon in each state at different temperatures depends on several factors. For example, at 600° C. one may incorporate nearly all the carbon in substitutional lattice sites if the alloyed composition was less than 0.5 atomic percent. Above 1 atomic percent a larger and larger fraction of the carbon would enter the MST film in positions not on lattice sites. Different factors affect the final substitutional/interstitial/precipitate state of the carbon, such as film growth rate, source gas chosen, etc.

The pulsed dosed carbon process described herein gives the process engineer more control over the carbon incorporation as compared to standard co-flowed silicon carbon epitaxy, since the carbon is predominately first incorporated in subsurface sites. For traditional silicon carbon epitaxy to obtain greater than or equal to one atomic substitutional carbon, growth temperatures at or below 550° C. may be used, although such low deposition temperatures may be challenging. The low temperature is used to provide substitutional carbon, but often coincide with lower growth rates and low as grown crystal quality. The pulsed carbon deposition in conjunction with etching helps ensure that carbon is incorporated on lattice sites, and the process conditions out defects and carbon precipitates since defects and precipitates etch faster than defect free epitaxy.

An example gas source which may be used for pulsed dosed carbon deposition is propene ($C_3H_6$), aka propylene or methyl ethylene. This is an organic carbon source liquid at room temperature, and it has a vapor pressure slightly higher than $SiH_2Cl_2$ (DCS). This allows vapor delivery via a mass flow controller (MFC) without the need for a bubbler. In propene process metals testing, propene was tested in the 530° C. to 800° C. with good results. More particularly, no excessive chamber discoloration from propene deposits was observed, nor was any metal contamination based on 30 element VPD-ICP-MS test. All metals were below the detection limit of the test.

For the process described in FIG. 6, the various steps are cycled until the required thickness/configuration of the superlattice 120 is achieved. It should be noted that the order in which the carbon and oxygen dosing steps are performed may be opposite the order shown (e.g., the carbon monolayer 150b may be at the bottom of the superlattice 120), or co-dosed for a carbon-oxygen monolayers, in some embodiments.

Referring additionally to FIGS. 7-11, the foregoing will be further understood with reference to secondary ion mass spectroscopy (SIMS) diagrams 170, 180, 190, 200, and X-ray diffraction (XRD) diagram 210 for example process flows used to fabricate the semiconductor device 120. In the example shown in SIMS diagram 170, an oxygen dose of $1.1E15$ at/$cm^2$ (16O) was used along with a $1.49E14$ at/$cm^2$ dose of carbon. This resulted in a 0.22 atomic percent of carbon in the device, which is compatible with carbon percentages used for heterojunction bi-polar transistor (HBT) technology for dopant blocking. Use of the above described process resulted in desired silicon crystal quality, no appreciable disruption of the atomic alignment, and a relatively clean mass contrast between the oxygen and the silicon in cross-sectional transmission electron microscopy (X-TEM).

A different process run is illustrated in the SIMS diagram 180, in which the carbon (12C) dosage was $4.27E17$ at/$cm^2$ (with a peak of $4.6E20$ at/$cm^3$) and the oxygen (16O) dosage was $1.16E15$ at/$cm^2$. This approach demonstrated 0.96 atomic % carbon levels, which would be compatible with applications including, for example: MOSFET planar and 3D architectures such as finFETs; dopant blocking; stressors; and micro-electromechanical system (MEMS) and substrate applications such as etch stop layers and graded buffers for small lattice constant material on silicon. Further details regarding the implementation of MST films in such applications are set forth in U.S. Pat. Pub. Nos. 2007/0020860; 2007/0015344; 2007/0007508; 2007/0010040; 2006/0292765; 2006/0273299; and U.S. Pat. Nos. 7,531,828; 7,586,165; 7,598,515; 7,202,494; 10,580,867; 10,854,717; and 10,840,337, all of which are assigned to the present Applicant and hereby incorporated herein in their entireties by reference.

Still another process run is illustrated in the SIMS diagram 190, in which the carbon (12C) dosage was $6.97E14$ at/$cm^2$ (with a peak of $6.2E20$ at/$cm^3$) and the oxygen (16O) dosage was $1.16E15$ at/$cm^2$. This resulted in a film with 1.2 atomic % carbon, which may be beneficial for applications such as stressors, etch stops, and dopant blocking, for example.

Figure 10:
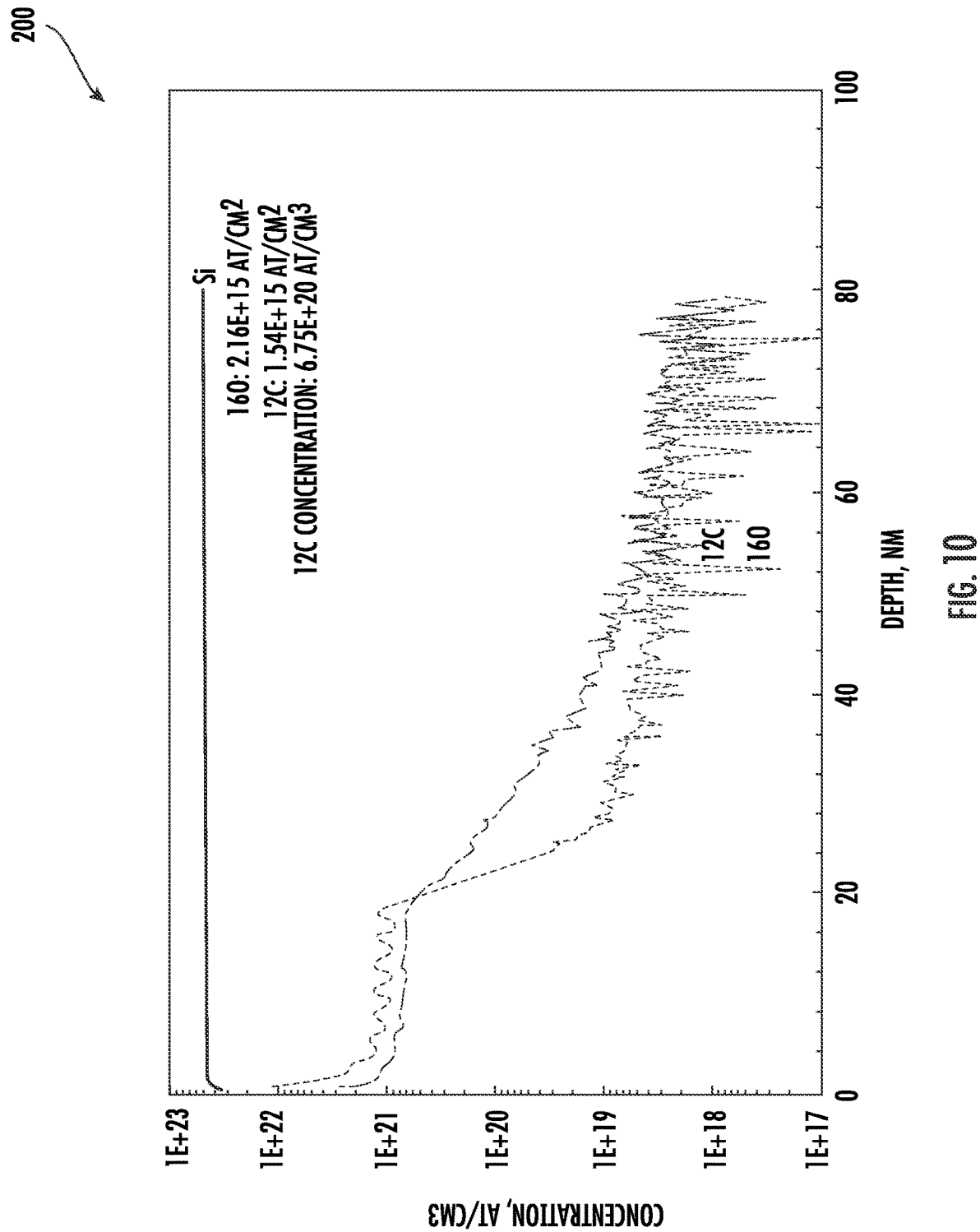
Figure 11:
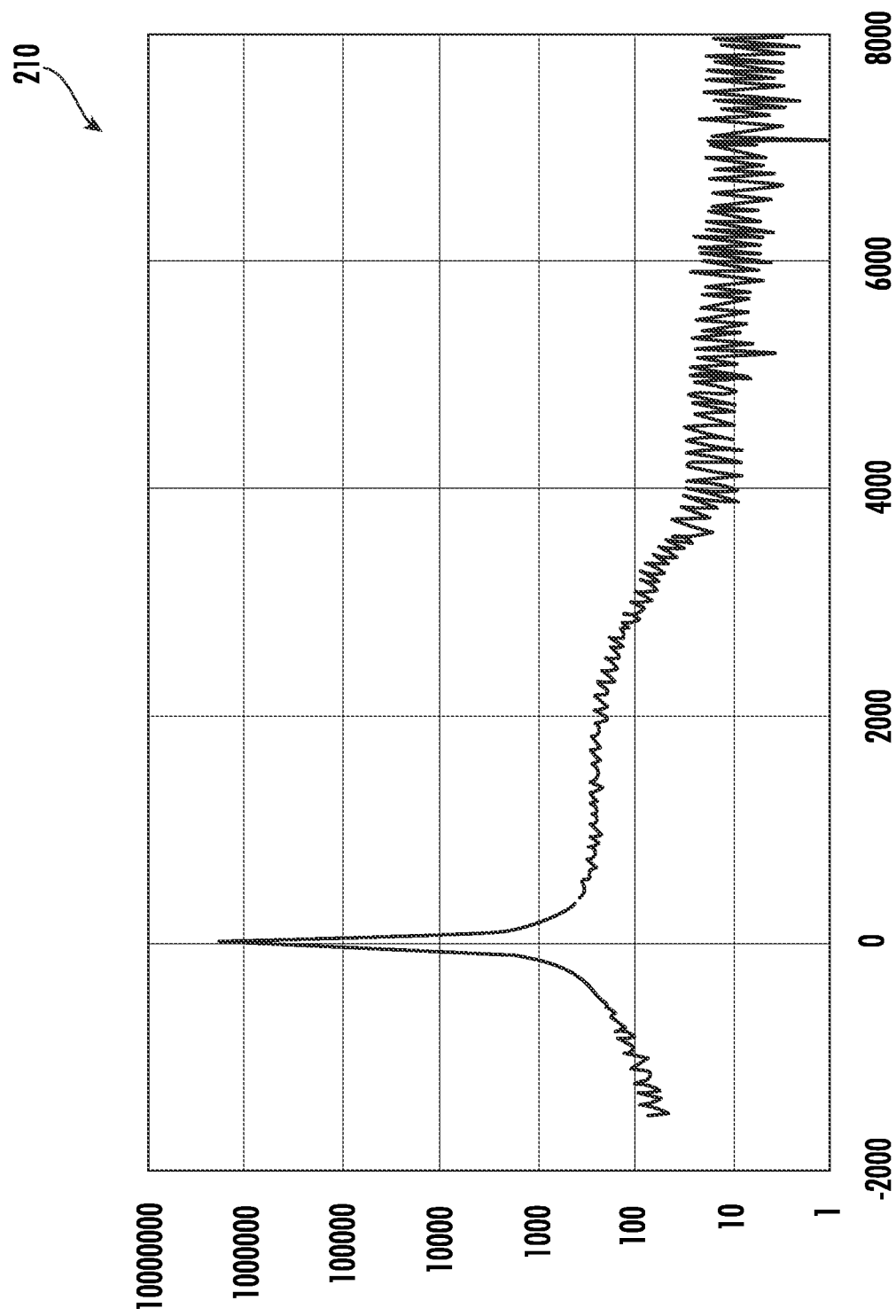
FIG. 11 is an X-ray diffraction (XRD) diagram corresponding to the fabrication run represented in FIG. 10.

Yet another process run is illustrated in the SIMS diagram 200, in which the carbon (12C) dosage was $1.54E15$ at/$cm^2$ (with a 12C concentration of $6.75E20$ at/$cm^3$) and the oxygen (16O) dosage was $2.16E15$ at/$cm^2$. This run was similar to that shown in FIG. 7, but without an epitaxial silicon cap and including eight pulsed growth cycles. Stable carbon and oxygen dosing concentrations were achieved, as seen in FIG. 10. Furthermore, the X-ray analysis illustrated in the XRD diagram 210 confirms that the carbon in the sample represented in FIG. 10 is substitutional based on the tensile strained carbon peak shown in the diffraction spectra. Also for this sample, Fourier Transform Infrared Spectroscopy (FTIR) analysis confirmed that the carbon in the sample is substitutional and thus resulting in a tensile strained epitaxial layer. A spectra peak at 612 cm$^{-1}$ indicates that the carbon is bonded with silicon on lattice sites, and not bonding in the layer as silicon carbide precipitates.

An important process step in the fabrication of many semiconductor devices is to perform an etch. In some cases it is important for the etch to be uniform, but in other cases it is desirable for an etch to be selective, or to stop at a particular depth. One example is in the formation of gate-all-around (GAA) devices, where commonly a stack of alternating silicon (Si) and silicon germanium (SiGe) is grown such that later in the process the SiGe may be selectively etched to leave only the silicon, prior to forming a gate around the silicon. In other devices, for example certain image sensor or RF devices, it is desirable to remove the silicon underneath the device of interest, or to etch silicon to a particular depth. There are many more examples that would be familiar to one skilled in the art.

Typical Si/O MST film recipes are such that the etch rate is very similar to bulk silicon. However, the above-noted recipes for the superlattice 125 may provide significantly different etch rates compared to bulk silicon, such that this film may be used in selective etch, or etch stop applications, as noted above. In this regard, the incorporation of other elements into the film in addition to oxygen may advantageously facilitate achieving a "signal" that could be used to indicate an end point for a given etch, as will be appreciated by those skilled in the art.

In an example application, the superlattice 125 may be used as a channel material for advanced logic applications (e.g., in the case of NMOS) since tensile strain has the effect of improved electron mobility. Another application includes stressors, such as for recessed source/drain configurations. This would involve doping the superlattice 125 with such dopants as Boron, Arsenic, or Phosphorus, for example. More particularly, the superlattice 125 may be used as a stressor liner to prevent the diffusion of dopants such as phosphorus or arsenic into the channel of the transistor. Lining a recess with the superlattice 125 has the effect of dopant blocking with minimal impact to film resistivity. By "liner" or "lining" it is meant that the superlattice 125 resides within the first several mono layers of the stressor recess.

Moreover, an important process step in the fabrication of many semiconductor devices is to perform an etch. In some cases it is important for the etch to be uniform, but in other cases it is desirable for an etch to be selective, or to stop at a particular depth. One example is in the formation of gate-all-around (GAA) devices (which will be discussed further below with reference to FIGS. 16-17), where commonly a stack of alternating silicon (Si) and silicon germanium (SiGe) is grown such that later in the process the SiGe may be selectively etched to leave only the silicon, prior to forming a gate around the silicon. In other devices, for example certain image sensor or RF devices, it is desirable to remove the silicon underneath the device of interest, or to etch silicon to a particular depth. There are many more examples that would be familiar to one skilled in the art.

Typical MST silicon recipes are such that the etch rate is very similar to regular silicon. However, the SiC/SiCO MST film recipes set forth herein may have significantly different etch rates compared to regular silicon, such that SiC/SiCO films can be used in selective etch, or etch stop applications.

It is also expected that the incorporation of other elements into the film may facilitate achieving a "signal" that could be used to indicate an end point for a given etch.

Other uses of the superlattice 125 include as an etch resistant material for applications such as Silicon on Insulator (SOI) and MEMS. More particularly, if an epitaxial layer of silicon germanium is grown as an etch resistant material for virtual substrate formation, the superlattice 125 may be added to compensate the compressive strain in the epitaxial silicon germanium layer that resulted by adding large germanium atoms in the epitaxial layer. The addition of the carbon may help prevent the epitaxial layer from relaxing after exceeding the critical thickness. Strained layers will relax once the epitaxial layer has exceeded the critical thickness, thus generating threading and misfit dislocation in the epitaxy. Another application for the superlattice 125 is graded buffer layers for strained-SOI. The superlattice 125 may further provide for dopant blocking in hetero-junction bi-polar transistors (HBT), as well as enhanced mobility, as discussed further above.

Figure 12:
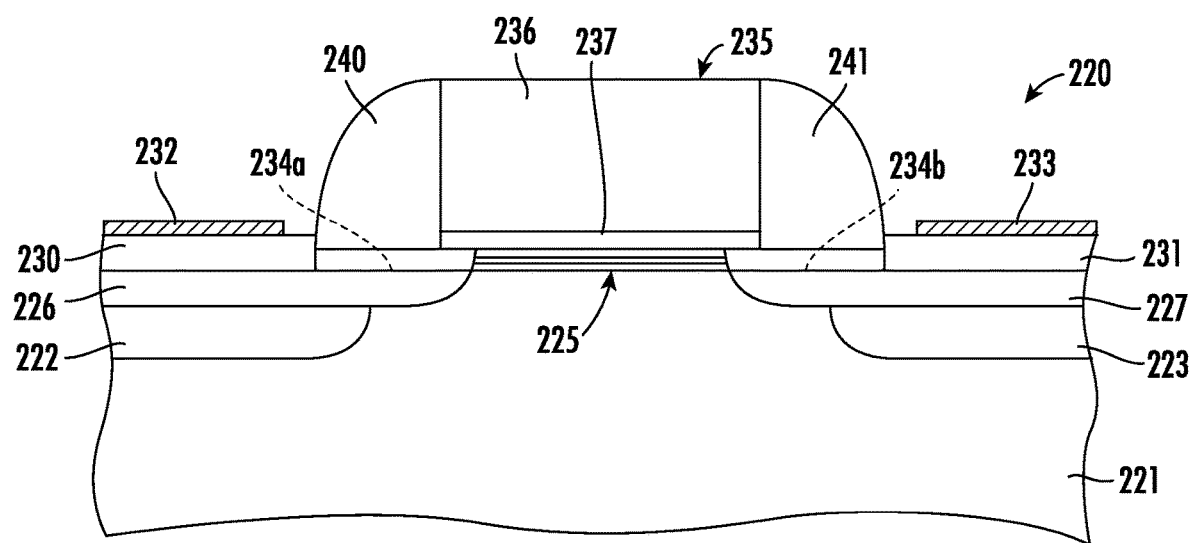
FIG. 12 is a schematic cross-sectional view of a semiconductor device including a superlattice channel incorporating the superlattice of FIG. 5.

Numerous types of semiconductor structures may be fabricated with, and benefit from, the above-described oxygen and carbon/carbon-oxygen superlattices. One such device is a planar MOSFET 220 now described with reference to FIG. 12. The illustrated MOSFET 220 includes a substrate 221, source/drain regions 222, 223, source/drain extensions 226, 227, and a channel region therebetween provided by an oxygen and carbon/carbon-oxygen superlattice 225. The channel may be formed partially or completely within the superlattice 225. Source/drain silicide layers 230, 231 and source/drain contacts 232, 233 overlie the source/drain regions as will be appreciated by those skilled in the art. Regions indicated by dashed lines 234a, 234b are optional vestigial portions formed originally with the superlattice 225, but thereafter heavily doped. In other embodiments, these vestigial superlattice regions 234a, 234b may not be present as will also be appreciated by those skilled in the art. A gate 235 illustratively includes a gate insulating layer 237 adjacent the channel provided by the superlattice 225, and a gate electrode layer 236 on the gate insulating layer. Sidewall spacers 240, 241 are also provided in the illustrated MOSFET 220.

Figure 13:
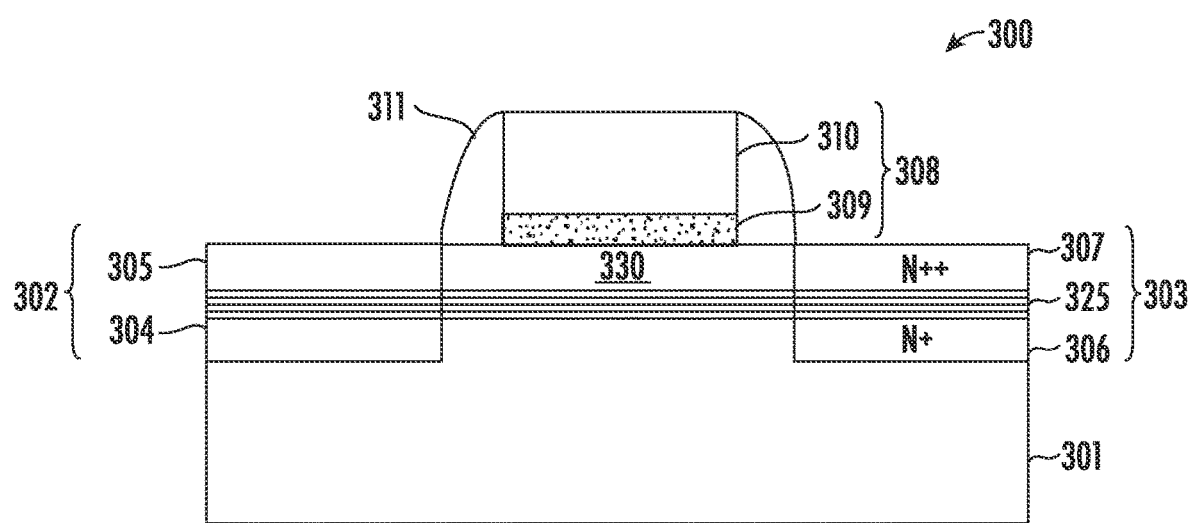
FIG. 13 is a schematic cross-sectional view of a semiconductor device including the superlattice of FIG. 5 dividing a semiconductor layer into regions having a same conductivity type and different dopant concentrations.

Referring additionally to FIG. 13, in accordance with another example of a device in which an oxygen and carbon/carbon-oxygen superlattice 325 may be incorporated is a semiconductor device 300, where the superlattice is used as a dopant diffusion blocking superlattice to advantageously increase surface dopant concentration to allow a higher $N_D$ (active dopant concentration at metal/semiconductor interface) during in-situ doped epitaxial processing by preventing diffusion into a channel region 330 of the device. More particularly, the device 300 illustratively includes a semiconductor layer or substrate 301, and spaced apart source and drain regions 302, 303 formed in the semiconductor layer with the channel region 330 extending therebetween. The dopant diffusion blocking superlattice 325 illustratively extends through the source region 302 to divide the source region into a lower source region 304 and an upper source region 305, and also extends through the drain region 303 to divide the drain region into a lower drain region 306 and an upper drain region 307.

The dopant diffusion blocking superlattice 325 may also conceptually be considered as a source dopant blocking superlattice within the source region 302, a drain dopant blocking superlattice within the drain region 303, and a body dopant blocking superlattice beneath the channel 330, although in this configuration all three of these are provided by a single blanket deposition of the MST material across the substrate 301 as a continuous film. The semiconductor material above the dopant blocking superlattice 325 in which the upper source/drain regions 305, 307 and channel region 330 are defined may be epitaxially grown on the dopant blocking superlattice 325 either as a thick superlattice cap layer or bulk semiconductor layer, for example. In the illustrated example, the upper source/drain regions 305, 307 may each be level with an upper surface of this semiconductor layer (i.e., they are implanted within this layer).

As such, the upper source/drain regions 305, 307 may advantageously have a same conductivity as the lower source/drain regions 304, 306, yet with a higher dopant concentration. In the illustrated example, the upper source/drain regions 305, 307 and the lower source/drain regions 304, 306 are N-type for a N-channel device, but these regions may also be P-type for a P-channel device as well. Surface dopant may be introduced by ion implantation, for example. Yet, the dopant diffusion is reduced by the MST film material of the diffusion blocking superlattice 325 because it traps point defects/interstitials introduced by ion implantation which mediate dopant diffusion.

The semiconductor device 300 further illustratively includes a gate 308 on the channel region 330. The gate illustratively includes a gate insulating layer 309 gate electrode 310. Sidewall spacers 311 are also provided in the illustrated example. Further details regarding the device 300, as well as other similar structures in which an oxygen and carbon/carbon-oxygen superlattice may be used, are set forth in U.S. Pat. No. 10,818,755 to Takeuchi et al., which is assigned to the present Applicant and hereby incorporated herein in its entirety by reference.

Figure 14:
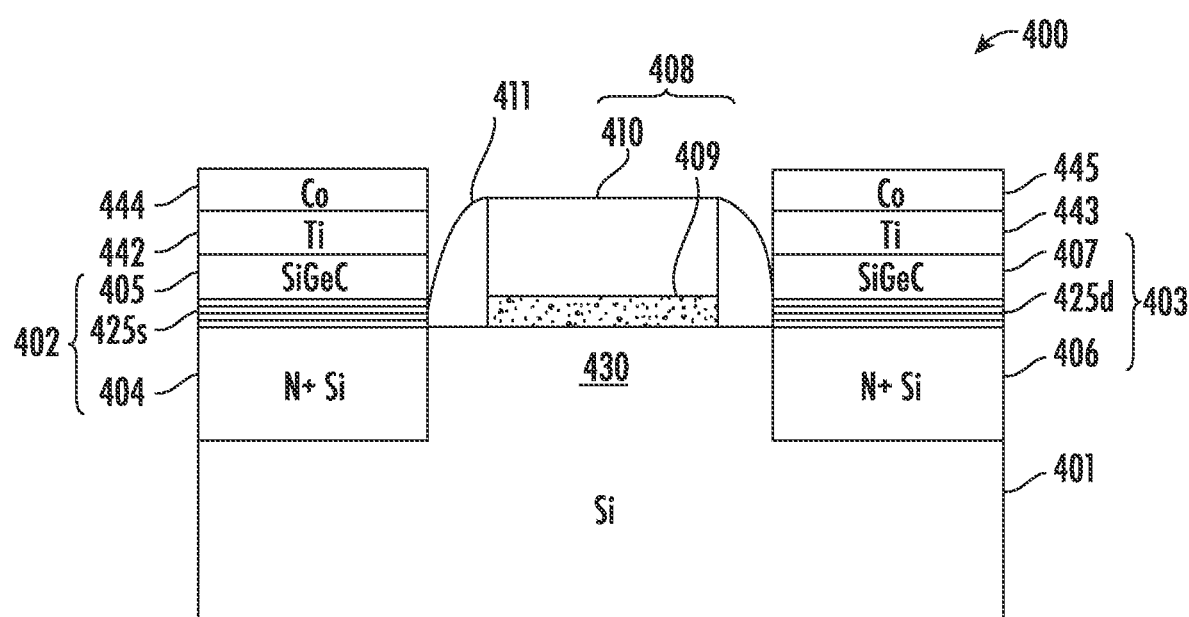
FIG. 14 is a schematic cross-sectional view of a semiconductor device including the superlattice of FIG. 5 and a metal contact layer above the superlattice.

Turning to FIG. 14, another example embodiment of a semiconductor device 400 in which an oxygen and carbon/carbon-oxygen superlattice may be used is now described. More particularly, in the illustrated example both source and drain dopant diffusion blocking superlattices 425s, 425d advantageously provide for Schottky barrier height modulation via hetero-epitaxial film integration. More particularly, the lower source and drain regions 404, 406 include a different material than the upper source and drain regions 405, 407. In this example, the lower source and drain regions 404, 406 are silicon, and the upper source and drain regions 405, 407 are SiGeC, although different materials may be used in different embodiments. Lower metal layers (Ti) 442, 443 are formed on the upper source and drain regions (SiGeC layers) 405, 407. Upper metal layers (Co) 444, 445 are formed on the lower metal layers 442, 443, respectively. Because the MST material is effective in integrating heteroepitaxial semiconductor material, incorporation of C (1-2%) to Si or SiGe on Si may induce a positive conduction band offset. More particularly, this is a SiGeC/MST/n+Si structure that is effective for reducing Schottky barrier height. Further details regarding the device 400 are set forth in the above-noted '755 patent.

Figure 15:
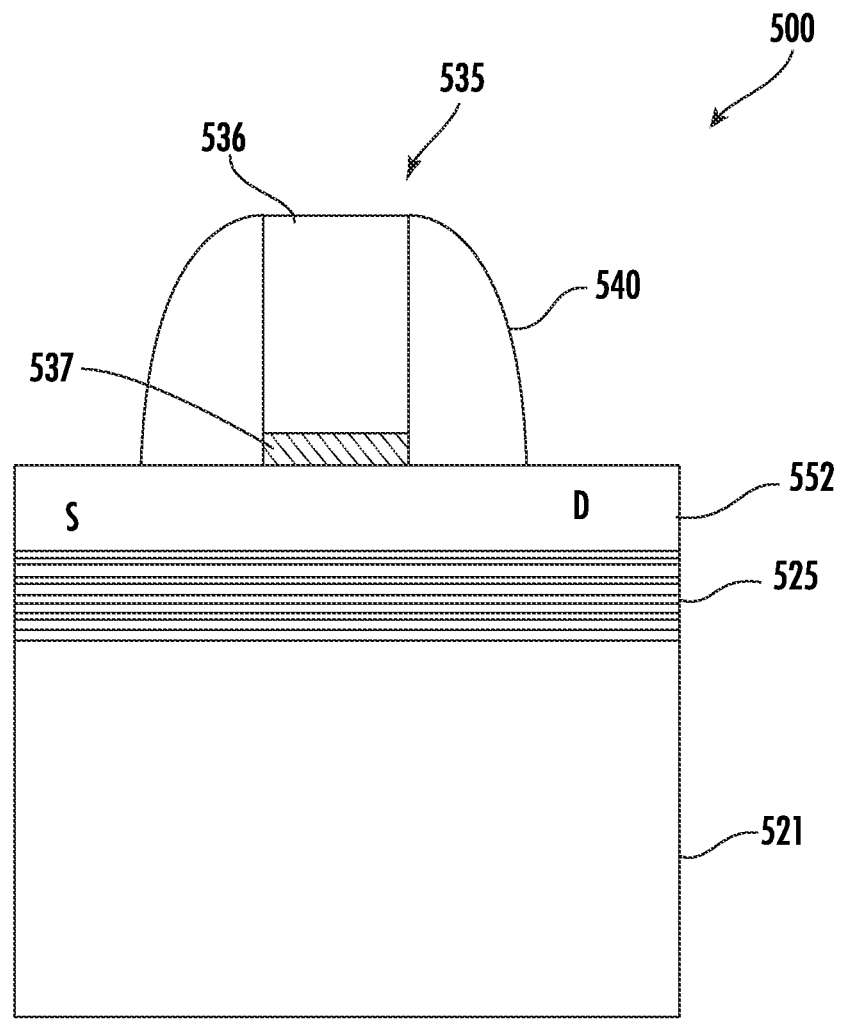
FIG. 15 is a schematic cross-sectional diagram of a planar MOSFET device incorporating the superlattice of FIG. 5 in an example embodiment.

Referring to FIG. 15, an example embodiment of a planar MOSFET 500 in which a superlattice 525 with oxygen and carbon/carbon/oxygen monolayer may be used as a stressor for a semiconductor (active device) layer 552 is now described. Generally speaking, electrons and holes have higher mobility in strained (biaxial tension) silicon. It is desirable that stress polarity be optimized in each direction, separately for NMOS and PMOS devices. A silicon cap/SiGe/silicon substrate structure has been studied for NMOS mobility improvement, in which the silicon cap is stressed to tensile by the insertion of the underlying SiGe layer. In the illustrated example, rather than a SiGe layer, the superlattice film 525 including one or more carbon/carbon-oxygen monolayers may advantageously induce a compressive stress in the silicon cap layer 552. Because the atomic radius of C<Si<Ge, this configuration is also advantageously suitable for PMOS device in the longitudinal direction (i.e., between the source S and drain D). The superlattices 525 may accordingly provide desired stress polarity for mobility improvement. In some embodiments, the upper cap layer 552 may comprise another or different semiconductor, such as strained SiGe, for example. Moreover, the gate 535, which illustratively includes a gate electrode 536 and gate dielectric 537, and is surrounded by sidewall spacers 540, may be a high K metal gate formed in a gate-first or gate-last configuration, as will be appreciated by those skilled in the art.

Figure 16:
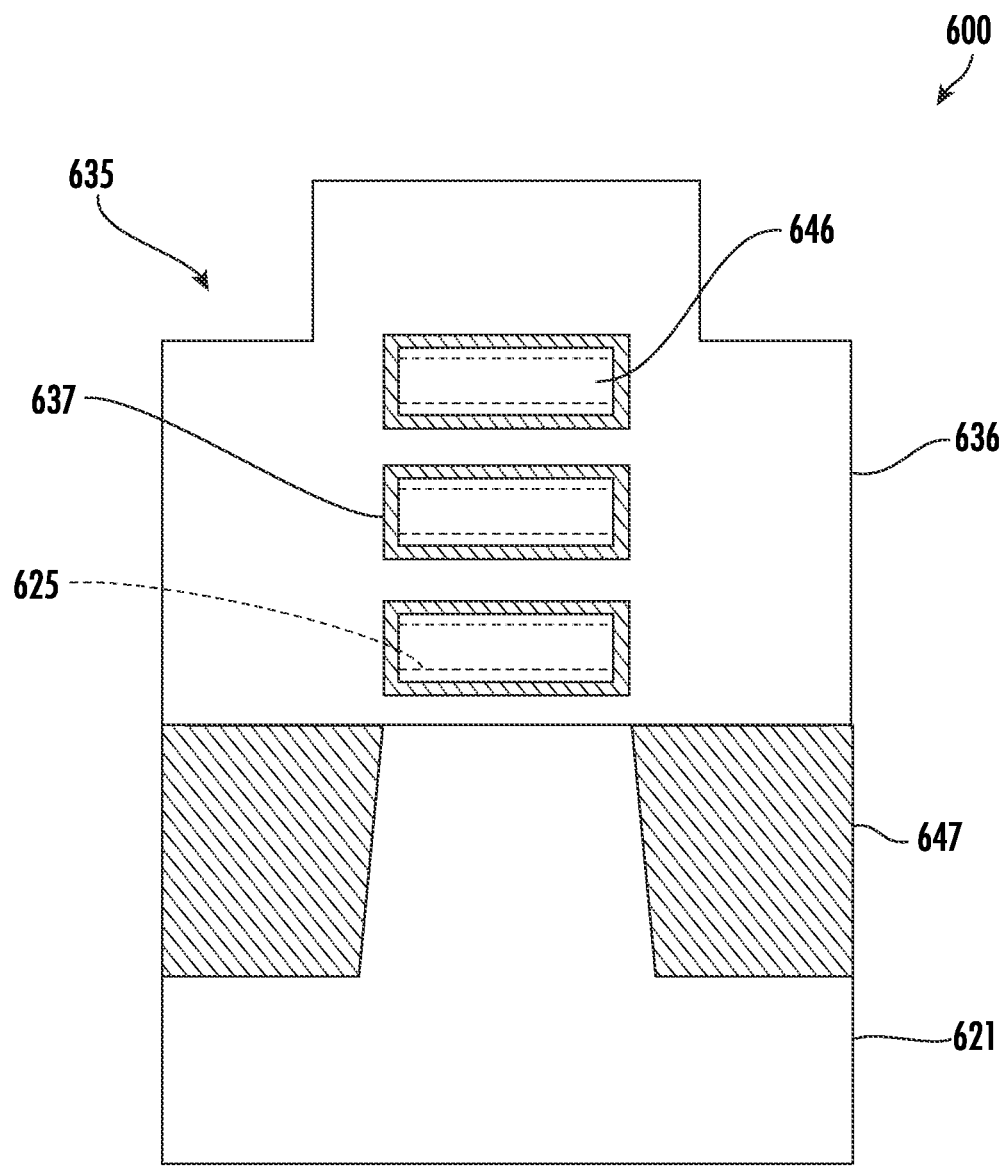
FIGS. 16-17 are schematic cross-sectional diagrams of stacked nanosheet gate all around (GAA) transistors incorporating the superlattice of FIG. 5.
Figure 17:
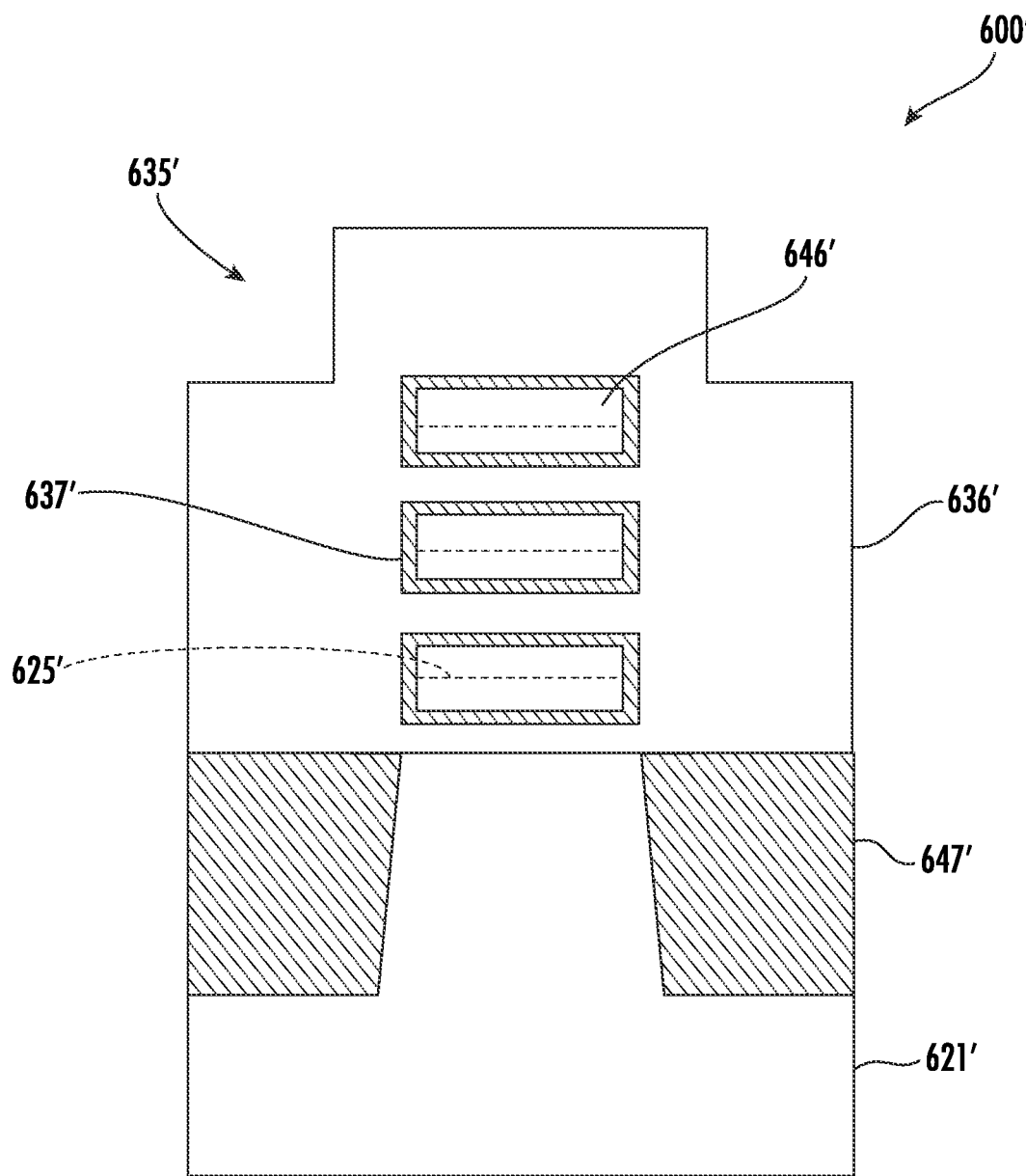

Referring additionally to FIG. 16, in accordance with another example embodiment a stacked nanosheet GAA transistor 600 which incorporates the above-described oxygen and carbon/carbon-oxygen superlattice films 625 is now described. The transistor 600 illustratively includes a substrate 621 with shallow trench isolation (STI) regions 647 therein. The semiconductor (e.g., silicon) nanosheets 646, which define the channel of the transistor, are arranged in a vertically stacked formation and surrounded by the gate oxide 637 and gate electrode 636 as shown. In the illustrated embodiment, a respective oxygen and carbon/carbon-oxygen superlattice 625 is formed at the top and bottom of each of the nanosheets 646 to provide desired stress therein, as discussed further above. In an alternative embodiment of the GAA transistor 600' shown in FIG. 17, oxygen and carbon/carbon-oxygen superlattices 625' are instead formed closer to the middle or center of the nanosheets 646'. It will be appreciated that other configurations are possible, with the superlattices 625, 625' being at the bottom, middle, and/or top of each nanosheets 646, 646', and the configuration may be changed from one nanosheet to the next, if desired.

It should also be noted that in some example implementations, $^{28}$Si and/or $^{18}$O materials may also be incorporated in the above-described oxygen and carbon/carbon-oxygen MST films, as respectively described further in co-pending U.S. application Ser. Nos. 17/236,329 and 17/236,289 filed Apr. 21, 2021, and U.S. application Ser. Nos. 17/330,860 and 17/330,831 filed May 26, 2021, all of which are assigned to the present Applicant and are hereby incorporated herein in their entireties by reference.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

The invention claimed is:

1. A method for making a semiconductor device comprising:
   forming a superlattice adjacent a semiconductor layer and comprising a plurality of stacked groups of layers, each group of layers comprising a plurality of stacked base semiconductor monolayers defining a base semiconductor portion, and at least one non-semiconductor monolayer constrained within a crystal lattice of adjacent base semiconductor portions;
   the at least one non-semiconductor monolayer in a first group of layers of the superlattice comprising oxygen and devoid of carbon, and the at least one non-semiconductor monolayer in a second group of layers of the superlattice comprising carbon; and performing an etch while using the superlattice as an etch stop layer.

2. The method of claim 1 wherein the second group of layers is above the first group of layers in the superlattice.

3. The method of claim 1 wherein the semiconductor device comprises a Silicon on Insulator (SOI) semiconductor device.

4. The method of claim 1 wherein the semiconductor device comprises a Micro-electromechanical System (MEMS) semiconductor device.

5. The method of claim 1 wherein the second group of layers of the superlattice comprises carbon and is devoid of oxygen.

6. The method of claim 1 wherein the second group of layers of the superlattice comprises carbon and oxygen.

7. The method of claim 1 wherein the base semiconductor portion comprises silicon.

8. A method for making a semiconductor device comprising:

forming a superlattice adjacent a semiconductor layer and comprising a plurality of stacked groups of layers, each group of layers comprising a plurality of stacked base silicon monolayers defining a base silicon portion, and at least one non-semiconductor monolayer constrained within a crystal lattice of adjacent base semiconductor portions;

the at least one non-semiconductor monolayer in a first group of layers of the superlattice comprising oxygen and devoid of carbon, and the at least one non-semiconductor monolayer in a second group of layers of the superlattice comprising carbon and devoid of oxygen; and performing an etch while using the superlattice as an etch stop layer.

9. The method of claim 8 wherein the second group of layers is above the first group of layers in the superlattice.

10. The method of claim 8 wherein the semiconductor device comprises a Silicon on Insulator (SOI) semiconductor device.

11. The method of claim 8 wherein the semiconductor device comprises a Micro-electromechanical System (MEMS) semiconductor device.

12. A method for making a semiconductor device comprising:

forming a superlattice adjacent a semiconductor layer and comprising a plurality of stacked groups of layers, each group of layers comprising a plurality of stacked base silicon monolayers defining a base silicon portion, and at least one non-semiconductor monolayer constrained within a crystal lattice of adjacent base semiconductor portions;

the at least one non-semiconductor monolayer in a first group of layers of the superlattice comprising oxygen and devoid of carbon, and the at least one non-semiconductor monolayer in a second group of layers of the superlattice comprising carbon and oxygen; and performing an etch while using the superlattice as an etch stop layer.

13. The method of claim 12 wherein the second group of layers is above the first group of layers in the superlattice.

14. The method of claim 12 wherein the semiconductor device comprises a Silicon on Insulator (SOI) semiconductor device.

15. The method of claim 12 wherein the semiconductor device comprises a Micro-electromechanical System (MEMS) semiconductor device.

* * * * *